United States Patent
Sakamoto

(10) Patent No.: US 9,097,991 B2
(45) Date of Patent: Aug. 4, 2015

(54) EXPOSURE APPARATUS, METHOD OF CONTROLLING THE SAME AND METHOD OF MANUFACTURING DEVICE

(71) Applicant: Canon Kabushiki Kaisha, Tokyo (JP)

(72) Inventor: Noritoshi Sakamoto, Shimotsuga-gun (JP)

(73) Assignee: CANON KABUSHIKI KAISHA (JP)

( * ) Notice: Subject to any disclaimer, the term of this patent is extended or adjusted under 35 U.S.C. 154(b) by 300 days.

(21) Appl. No.: 13/804,138

(22) Filed: Mar. 14, 2013

(65) Prior Publication Data
US 2013/0258308 A1    Oct. 3, 2013

(30) Foreign Application Priority Data

Mar. 30, 2012   (JP) .................. 2012-082090

(51) Int. Cl.
| | |
|---|---|
| *G01B 11/00* | (2006.01) |
| *G03B 27/32* | (2006.01) |
| *G03B 27/54* | (2006.01) |
| *G03B 27/58* | (2006.01) |
| *G03C 9/00* | (2006.01) |
| *G03F 5/00* | (2006.01) |

(Continued)

(52) U.S. Cl.
CPC ........ *G03F 7/70775* (2013.01); *G03F 7/70608* (2013.01); *G03F 7/70633* (2013.01); *G03F 9/7034* (2013.01); *G03F 9/7084* (2013.01)

(58) Field of Classification Search
CPC ............ G03F 7/70483; G03F 7/70608; G03F 7/70616; G03F 7/70633; G03F 7/70641; G03F 7/70775; G03F 9/70; G03F 9/7003; G03F 9/7026; G03F 9/7034; G03F 9/7084; G03F 2009/005

USPC ............ 355/55, 67, 68, 72, 77; 356/399–401, 356/630; 430/22, 30
See application file for complete search history.

(56) References Cited

U.S. PATENT DOCUMENTS

| | | | |
|---|---|---|---|
| 4,001,774 A | | 1/1977 | Dawson et al. |
| 6,376,329 B1 * | | 4/2002 | Sogard et al. ................ 438/401 |
| 2002/0025482 A1 | | 2/2002 | Imai |

(Continued)

FOREIGN PATENT DOCUMENTS

| | | |
|---|---|---|
| EP | 0833208 A2 | 4/1998 |
| JP | 05-315221 A | 11/1993 |

(Continued)

OTHER PUBLICATIONS

Korean Office Action cited in Korean counterpart application No. KR10-2013-0034166, dated Aug. 22, 2014.

(Continued)

*Primary Examiner* — Colin Kreutzer
(74) *Attorney, Agent, or Firm* — Rossi, Kimms & McDowell LLP

(57) ABSTRACT

An exposure apparatus exposes a resist on a substrate to light via an optical system. The exposure apparatus includes: a table configured to position the substrate at an exposure position upon holding the substrate; an obtaining unit configured to obtain a distance from an alignment mark formed on the substrate to a resist surface, and a tilt of the resist surface; and a control unit configured to calculate a correction value for correcting a shift in exposure position, that occurs upon tilt correction of the table, so as to reduce the tilt of the resist surface, using the distance and the tilt, and control a position of the table in accordance with the correction value.

11 Claims, 14 Drawing Sheets

(51) Int. Cl.
*G03F 7/20* (2006.01)
*G03F 9/00* (2006.01)

(56) References Cited

U.S. PATENT DOCUMENTS

2002/0109825 A1   8/2002   Gui et al.
2003/0133125 A1   7/2003   Hattori

FOREIGN PATENT DOCUMENTS

| JP | 06151277 A | 5/1994 |
| JP | 0766115 A | 3/1995 |
| JP | 2646417 B2 | 8/1997 |
| JP | 1154423 A | 2/1999 |
| JP | 2002-280299 A | 9/2002 |
| JP | 2003-203842 A | 7/2003 |

OTHER PUBLICATIONS

Chinese Office Action cited in Chinese counterpart application CN201310106051.8, dated Oct. 10, 2014. English translation provided.

* cited by examiner

F I G. 16A
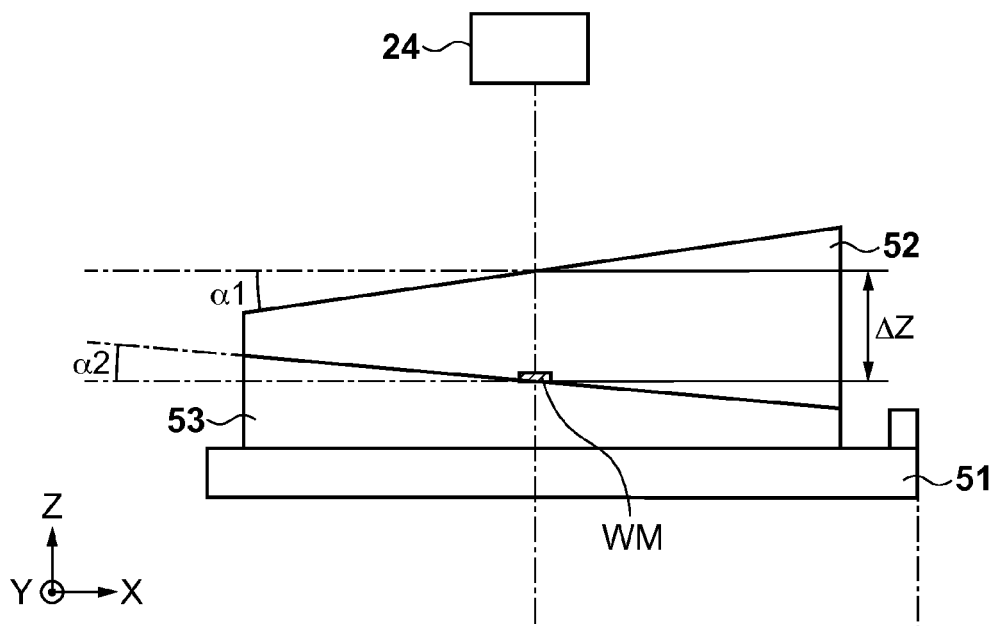
F I G. 16B
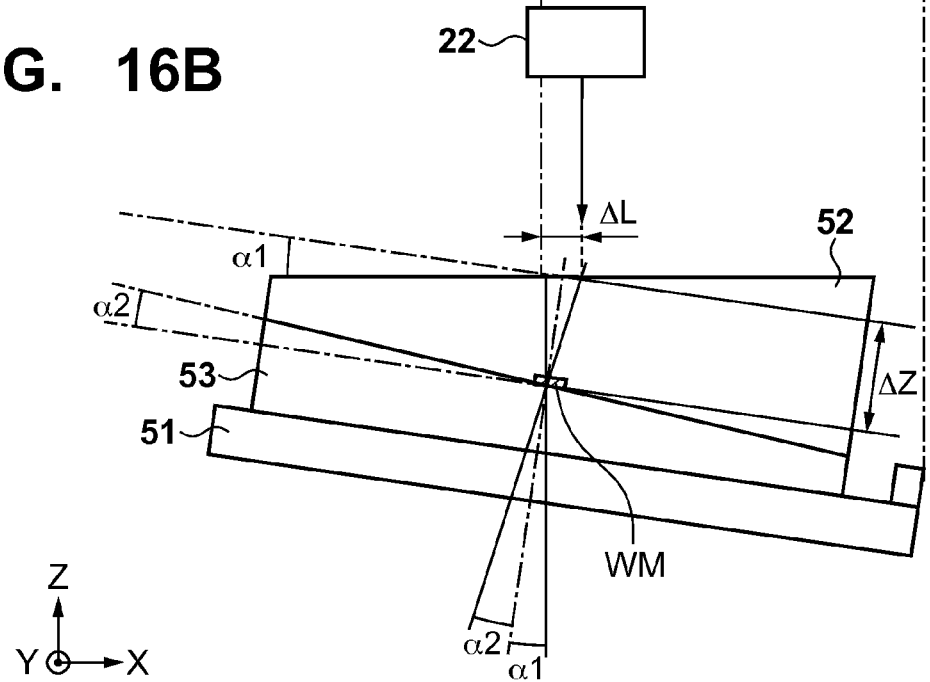

EXPOSURE APPARATUS, METHOD OF CONTROLLING THE SAME AND METHOD OF MANUFACTURING DEVICE

BACKGROUND OF THE INVENTION

1. Field of the Invention

The present invention relates to an exposure apparatus, a method of controlling the same, and a method of manufacturing a device.

2. Description of the Related Art

In recent years, ultrafine patterning techniques as techniques of manufacturing a semiconductor device have been making remarkable progress. In photopatterning techniques in particular, it is usual for a reduction projection exposure apparatus (stepper) having a submicron resolution to be used; so, for example, the numerical aperture (NA) of an optical system is increased, and the exposure wavelength is shortened to further improve the resolution. For example, as the exposure wavelength shortens, exposure light sources are shifting from g- and i-line high-pressure mercury lamps to KrF and ArF excimer lasers. However, as exposure light shifts to short-wavelength light emitted by, for example, a KrF excimer laser, the usable glass material is limited, so it becomes difficult to correct chromatic aberration for the alignment wavelength of a projection exposure optical system. Hence, the recent reduction projection exposure apparatus is required to adopt an off-axis alignment detection system (OA detection system) free from the influence of the chromatic aberration of a projection exposure optical system.

On the other hand, not only conventional IC chips including a memory and logic, but also recent special devices including a MEMS and CMOS are manufactured as applied products using a conventional semiconductor exposure apparatus. However, devices including a MEMS are different from IC chips in several respects. Devices including a MEMS are different from IC chips in that, for example, the former is required to attain a relatively low line width resolution and overlay accuracy but a relatively large depth of focus.

Also, a special exposure process of forming an alignment mark on the lower side of a silicon wafer, and exposing the upper side of the silicon wafer upon alignment with reference to the alignment mark must be done. This process is executed when, for example, a through-hole via is formed to extend from the upper side of a wafer, and used to electrically connect the upper side to a circuit pattern on the lower side. As a method of detecting an alignment mark formed on the lower side of a wafer, Japanese Patent Laid-Open No. 2002-280299, for example, discloses a lithography apparatus which performs alignment using a detection system arranged on the lower side (wafer chuck side). However, in the method of arranging a detection system on the wafer chuck side, only an alignment mark at a position opposite to a specific position of a wafer chuck is an object to be measured. That is, the measurement position is limited, so an alignment mark formed at an arbitrary position on the lower side of the wafer cannot be measured.

To solve this problem, a method of measuring an alignment mark on the upper side of a silicon wafer by an OA detection system including a light source that emits infrared light, using the property that silicon is transparent to infrared light (wavelength: 1,000 nm or more), is available. In lower surface alignment in which silicon has a given thickness from the wafer surface to an alignment mark, variations in tilt of, for example, a wafer table or chuck with respect to the wafer surface may occur due to variations in thickness of the silicon wafer, and variations in overlay accuracy. It has been pointed out that in conventional techniques, the detection accuracy degrades upon a tilt of, for example, the wafer table or chuck.

More specifically, as has been reported conventionally, in a measurement technique such as an interferometer, a shift occurs in position to be exposed, when a wafer is exposed in a tilted state. Japanese Patent Laid-Open No. 5-315221, for example, discloses a method of detecting the tilt of an interferometer mirror, detecting the tilt of a wafer by a tilt measurement device, and calculating the amount of flexure of a table due to its self weight, thereby calculating an Abbe error. With this method, the amount of tilt of the wafer is added to the correction items of the Abbe error to measure the alignment mark with high accuracy. Also, Japanese Patent Laid-Open No. 2003-203842 discloses an arithmetic unit which calculates an error of a plane mirror for each position of a stage, and a method of driving the stage upon correcting the amount of tilt in accordance with the position, to which the stage moves, based on the error obtained by the arithmetic unit in advance.

A shift may occur in position to be exposed, during exposure when the tilt of the wafer surface changes upon lower surface alignment in which silicon has a given thickness from the wafer surface to an alignment mark, or in the interval between the alignment time and the exposure time if a thick resist is used. That is, when tilt correction is performed so as to reduce the tilt of the resist surface in exposure, a shift (shift error) may occur between a position to be ideally exposed and an actually exposed position. To attain exposure with a higher accuracy, a challenge associated with shift error correction is posed, but the conventional literatures describe no shift error correction methods.

FIGS. 12A and 12B are views for explaining a shift error that occurs in the interval between the alignment time and the exposure time, in which FIG. 12A shows an alignment state, and FIG. 12B shows an exposure state. Referring to FIG. 12A, an off-axis alignment detection system (OA detection system) 24 detects an alignment mark WM. Referring to FIG. 12B, a circuit pattern image of a mask (not shown) is transferred onto a wafer W via a projection optical system 22. The tilt of the wafer surface is different between the alignment state (FIG. 12A) and the exposure state (FIG. 12B).

The wafer W is set on a wafer chuck 51, and the alignment mark WM is formed on the surface of the wafer W, as shown in FIG. 12A. Also, the surface of the wafer W is coated (dispensed) with a resist 50. The thickness of the resist 50 on the wafer W is not uniform, but varies along the surface of the wafer W. For example, the thickness of the resist 50 on the right end side of the surface of the wafer W is defined as T1, and the thickness of the resist 50 on the left end side of the surface of the wafer W is defined as T2 (T2>T1). FIG. 12A assumes that the surface of the resist 50 has tilted with respect to an optical axis 1201 of a position detection system in wafer alignment (the surface of the resist 50 is not perpendicular to the optical axis of alignment). Although FIG. 12A shows an exemplary state in which the tilt of the surface of the resist 50 changes linearly, the definition of a shift error is not limited to this example.

On the other hand, FIG. 12B shows the state in which wafer surface measurement is performed at an exposure position, the tilt of the wafer surface is corrected, and exposure is performed. Upon tilt correction, the surface of the resist 50 becomes perpendicular to the optical axis of the projection optical system 22. As can be seen from FIG. 12B, due to the difference in tilt of the wafer surface from the alignment state, the alignment position set during the alignment time shown in FIG. 12A shifts during the exposure time shown in FIG. 12B. A shift between the position in alignment and that in exposure becomes a shift error.

FIGS. 13A to 13C are views for explaining the case wherein exposure is performed using a method which does not perform shift error correction. FIG. 13A shows the state before alignment, FIG. 13B shows the state in which the tilt of the wafer surface is corrected, alignment is performed, and exposure is performed in this state, and FIG. 13C shows the state after exposure. An example shown in FIG. 13A assumes that the surface of the resist 50 has tilted with respect to a wafer surface on which an alignment mark WM1 is formed as an alignment reference. As shown in FIG. 13B, even if tilt correction is performed, and alignment is performed so as to match the optical axis of the projection optical system 22 (FIG. 12B) with the alignment mark WM1, an alignment mark WM2 at an actually exposed position shifts with respect to a position RP to be exposed. That is, a shift error (shift) occurs, as shown in FIG. 13C. This means that when a surface layer to be exposed has tilted with respect to a layer serving as an alignment reference, in which the alignment mark WM1 is formed, a shift error occurs even if the tilt of the wafer surface is corrected, as shown in FIG. 13B.

As a method of solving the above-mentioned problem, a method of preventing a change in tilt of the wafer surface between the alignment measurement time and the exposure time so that a circuit pattern layer in which an alignment mark to be measured becomes parallel to the tilted wafer surface is available. However, when a bond wafer as mainly used in, for example, lower surface alignment is used, it is necessary to adhere a support substrate to a substrate on which a circuit pattern layer is formed, so the flatness of the substrate may degrade.

Also, to polish the substrate so that the circuit pattern layer becomes parallel to the tilted wafer surface, this must be done while measuring the circuit pattern layer and the wafer surface, so the yield may lower due to increases in cost and number of manufacturing steps.

SUMMARY OF THE INVENTION

The present invention has been made in order to solve the above-mentioned problems, and provides a technique which allows high-accuracy exposure by correcting a shift in exposure position, that occurs upon tilt correction of a table, so as to reduce the tilt of a resist surface.

According to one aspect of the present invention, there is provided an exposure apparatus which exposes a resist on a substrate to light via an optical system, the apparatus comprising: a table configured to position the substrate at an exposure position upon holding the substrate; an obtaining unit configured to obtain a distance from an alignment mark formed on the substrate to a resist surface, and a tilt of the resist surface; and a control unit configured to calculate a correction value for correcting a shift in exposure position, that occurs upon tilt correction of the table, so as to reduce the tilt of the resist surface, using the distance and the tilt, and control a position of the table in accordance with the correction value.

According to another aspect of the present invention, there is provided a method of controlling an exposure apparatus which includes a table which positions a substrate at an exposure position upon holding the substrate, and exposes a resist on the substrate to light via an optical system, the method comprising: an obtaining step of obtaining a distance from an alignment mark formed on the substrate to a resist surface, and a tilt of the resist surface; a calculation step of calculating a correction value for correcting a shift in exposure position, that occurs upon tilt correction of the table, so as to reduce the tilt of the resist surface, using the distance and the tilt; and a control step of controlling a position of the table in accordance with the correction value calculated in the calculation step.

According to still another aspect of the present invention, there is provided a method of manufacturing a device, the method comprising steps of: exposing a resist on a substrate to light using an exposure apparatus as defined above; and developing the exposed resist.

According to the present invention, high-accuracy exposure is allowed by correcting a shift in exposure position, that occurs upon tilt correction of a table, so as to reduce the tilt of a resist surface.

Further features of the present invention will become apparent from the following description of exemplary embodiments with reference to the attached drawings.

BRIEF DESCRIPTION OF THE DRAWINGS

FIGS. 16A and 16B are views for explaining shift correction according to the fourth embodiment, in which the tilt angle of a surface on which an alignment mark WM is formed is reflected on a correction value.

DESCRIPTION OF THE EMBODIMENTS

Exemplary embodiments of the present invention will be described in detail below with reference to the accompanying drawings. However, constituent components described in these embodiments merely provide examples, so the technical scope of the present invention is determined by the scope of claims and is not limited by the following individual embodiments.

First Embodiment

Figure 1:
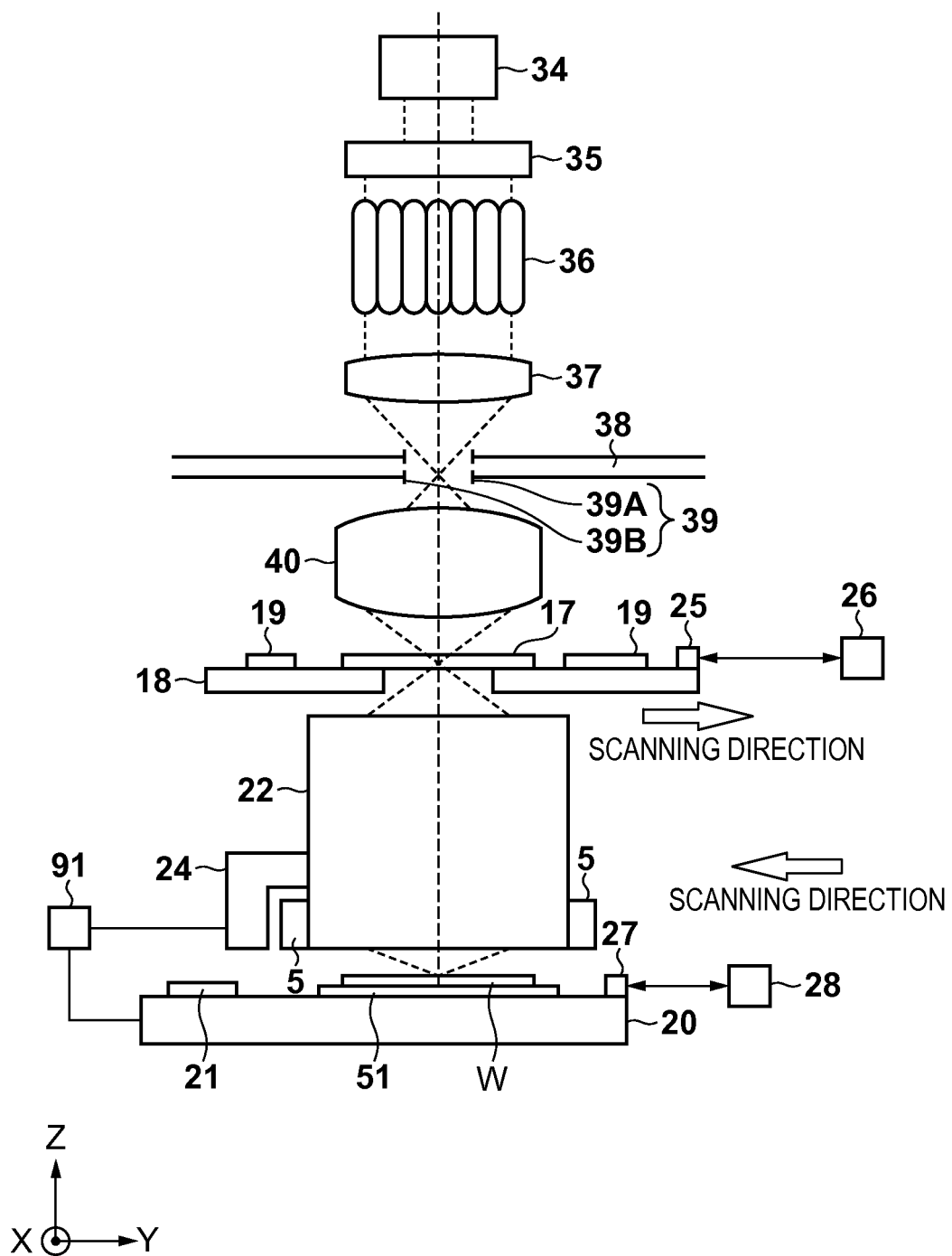
FIG. 1 is a view showing the schematic configuration of an exposure apparatus according to the first embodiment.

An exposure apparatus including an off-axis alignment detection system (OA detection system) 24 according to an embodiment of the present invention will be described. FIG. 1 is a view showing the schematic configuration of an exposure apparatus including an OA detection system. A light source 34 emits illumination light in a predetermined wavelength range. The illumination light emitted by the light source 34 enters an illumination optical system which illuminates a mask 17. The illumination optical system includes an illumination light shaping optical system 35, fly-eye lens 36, condenser lens 37, fixed field stop 38, variable field stop 39 (variable field stops 39A and 39B), and relay lens 40. The exposure apparatus projects and images the pattern of the mask 17 on a wafer W via a projection optical system 22. With this operation, a circuit pattern image of the mask 17 within a slit-shaped illumination region is transferred onto the wafer W via the projection optical system 22.

The light source 34 can be, for example, an excimer laser light source such as an ArF excimer laser or a KrF excimer laser, a metal vapor laser light source, a pulsed light source such as a high-frequency generator which uses a YAG laser, or a continuous light source which uses a mercury lamp and an elliptical reflecting mirror in combination. The wafer W is set on a wafer chuck 51 disposed on a wafer table 20 by a wafer transport device (not shown). The wafer table 20 includes a table which positions the wafer W in the optical axis direction (Z-direction) of the projection optical system 22, and another table which positions the wafer W within a plane (X-Y plane) perpendicular to the optical axis of the projection optical system 22. The position of the wafer table 20 is measured by an interferometer 28 and a reflecting mirror 27.

In exposing the wafer W, it is necessary to align the wafer W relative to the focus position of an image, formed by the projection optical system 22, in the focus direction. Focus detection units 5 arranged on the projection optical system 22 detect the position of the wafer W in the focus direction.

A slit pattern is projected onto the wafer W from an oblique direction by illumination light via the illumination optical system, mask, and projection optical system. The focus detection units 5 can measure the position of the wafer W in the focus direction based on the position of a slit image which is obtained by a photoelectric conversion element as light which bears the information of the slit pattern projected onto the wafer W is reflected by the surface of the wafer W. The off-axis alignment detection system (OA detection system) 24 is formed above the wafer W.

Figure 2:
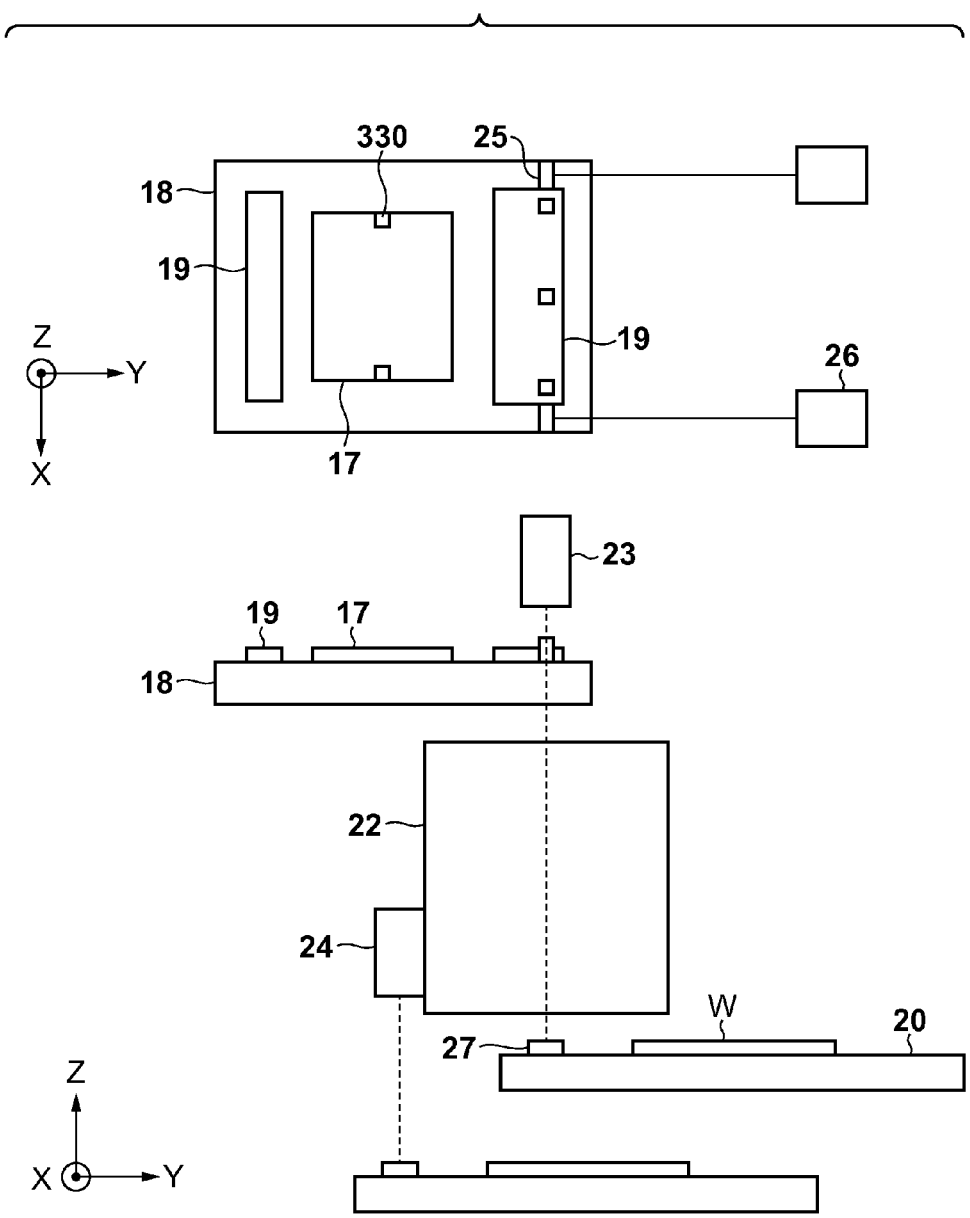
FIG. 2 is a schematic view showing the vicinity of a mask stage in the exposure apparatus shown in FIG. 1.

A baseline measurement method will be described below with reference to FIG. 2. FIG. 2 is a view showing the schematic configuration of the vicinity of a stage in the exposure apparatus described with reference to FIG. 1. A mask stage 18 is movable upon holding the mask 17. The position of the mask stage 18 is measured by an interferometer 26 and a reflecting mirror 25. The mask 17 is set on the mask stage 18, and mask reference marks 330 to serve as reference marks for positioning the mask 17 and mask stage 18 are formed on the mask stage 18. The mask 17 is positioned with reference to the mask reference marks 330, using a mask alignment microscope (not shown).

The relative position between baseline measurement marks formed on a mask reference plate 19, and marks on a stage reference plate 21 on the wafer table 20 is detected through the projection optical system 22 using an alignment microscope 23 (first step).

After the first step is completed, the wafer table 20 is moved to move the stage reference plate 21 to the observation region of the OA detection system 24. The relative position between the marks on the stage reference plate 21, and the reference marks in the OA detection system 24 is detected (second step).

The amount of a baseline is calculated based on the detection results obtained in the first and second steps. With this operation, the detection position of the OA detection system 24 relative to the exposure drawing center is obtained. By measuring the positions of the marks on the wafer W by the OA detection system 24, exposure can be started upon positioning the wafer W relative to the drawing center.

Figure 3:
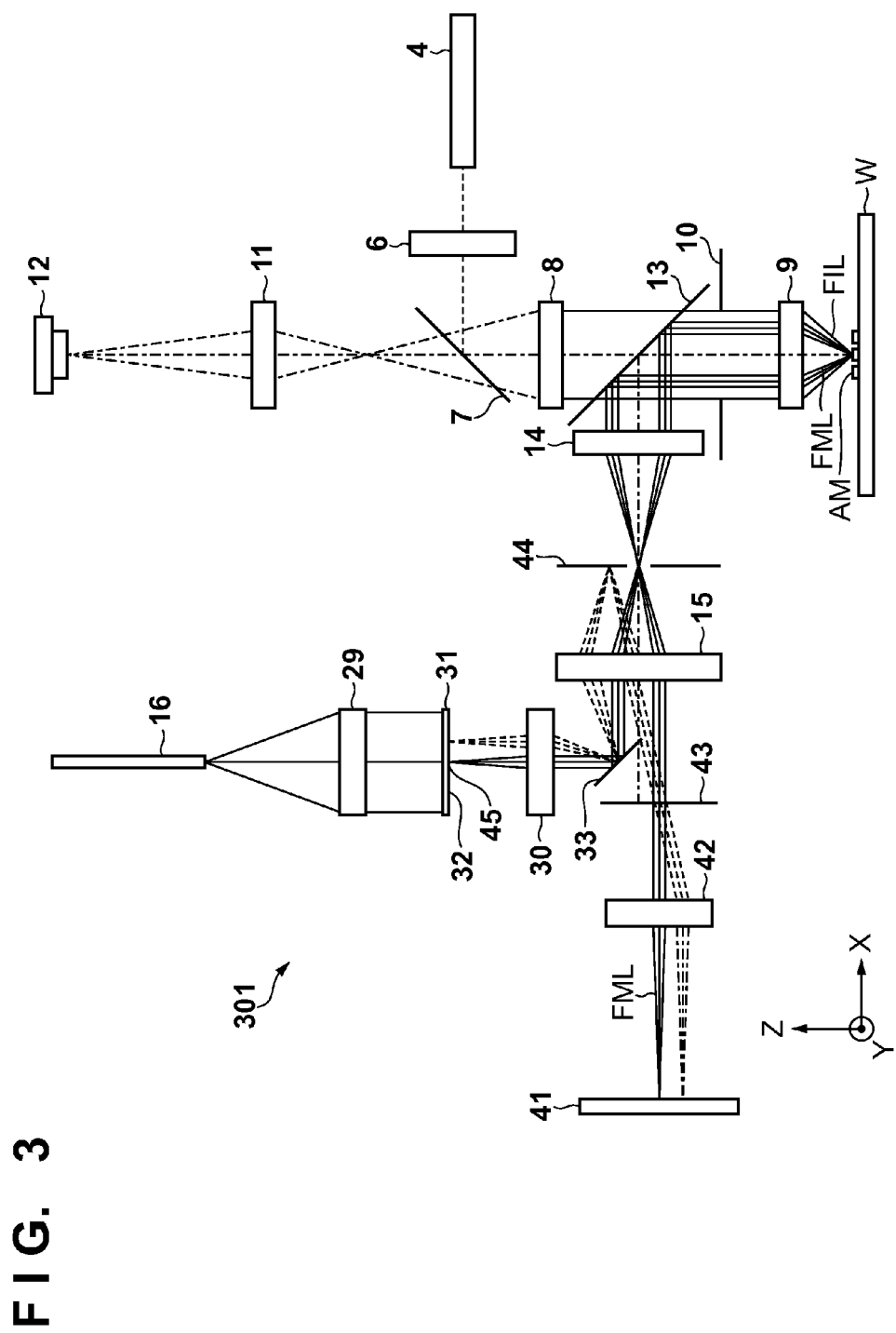
FIG. 3 is a schematic view showing a position detection unit in the exposure apparatus according to the first embodiment.

The OA detection system 24 (position detection unit) of the exposure apparatus will be described below with reference to the schematic view shown in FIG. 3. Referring to FIG. 3, light guided from an illumination light source 4 (for example, a fiber) is guided to a polarizing beam splitter 7 by an illumination optical system 6 to Kohler-illuminate alignment marks AM, formed on the wafer W, via a relay lens 8 and an objective lens 9.

Light beams reflected, diffracted, and scattered by the alignment marks AM form images of the alignment marks AM on a photoelectric conversion element 12 (for example, a CCD camera) by an imaging optical system 11. At this time, to detect the alignment marks AM on the wafer W with high accuracy, it is necessary to precisely detect the images of the alignment marks AM. The focus detection units 5 (FIG. 1) normally arranged on the projection optical system 22 can also be arranged in the OA detection system 24 as a focus detection system (to be referred to as an "AF system" hereinafter) 301 corresponding to the focus detection units 5. FIG. 3 does not illustrate the focus detection units 5 shown in FIG. 1.

An illumination lens 29 uniformly illuminates the surface of a slit member 31 with light emitted by an AF illumination light source 16 of the AF system 301. Light beams FIL (solid lines) having passed through a detection light slit 45 serving as a first aperture portion form slit images on an intermediate imaging plane by an AF illumination optical system 30, a mirror 33, and a second relay lens 15. A partial reflecting member 44 which partially reflects light is set on the intermediate imaging plane. The light beams having passed through the detection light slit 45 are transmitted through the transparent portion of the partial reflecting member 44, and directly guided to a first relay lens 14. The light beams are transmitted through the first relay lens 14, are reflected by a dichroic mirror 13, and pass through positions decentered on an objective lens pupil plane 10. Since the light beams having passed through the objective lens 9 are decentered on the pupil plane, they become detection light beams FIL upon oblique incidence on the surface of the wafer W to form an image of the detection light slit 45 on the wafer W. Light beams FML reflected by the wafer W pass through the side of the optical axis, that is opposite to the incident light, on the objective lens pupil plane 10, are transmitted through the dichroic mirror 13, first relay lens 14, and partial reflecting member 44 again, and pass through an aperture stop 43. The light beams FML having passed through the aperture stop 43 form an image of the detection light slit 45, formed on the wafer W, on a photoelectric conversion element 41 by an imaging lens 42. This makes it possible to detect a change in position of the wafer W in the focus direction as a slit position on the photoelectric conversion element 41.

Note that the illumination light source 4 uses at least one of visible light and infrared light. When alignment marks on the upper surface of the wafer W are measured, a visible-wavelength light source is used. When alignment marks on the lower surface of the wafer W are measured, an infrared-wavelength light source is used. Especially the transmittance of an Si wafer to the wavelength has the characteristic that it increases from a wavelength of about 1,000 nm. Therefore, it is only necessary to use a light source having a wavelength of 1,000 nm or more to allow lower surface detection, and a light source having a wavelength of 1,000 nm or less to allow upper surface observation. To obtain such wavelength characteristics, a method of disposing the illumination light source 4 on the fiber incident side (not shown) or switching the light source itself may be used. Either method can be used as long as a configuration capable of switching between visible light and infrared light, and guiding either of them to the OA detection system 24 is adopted.

Figure 4A:
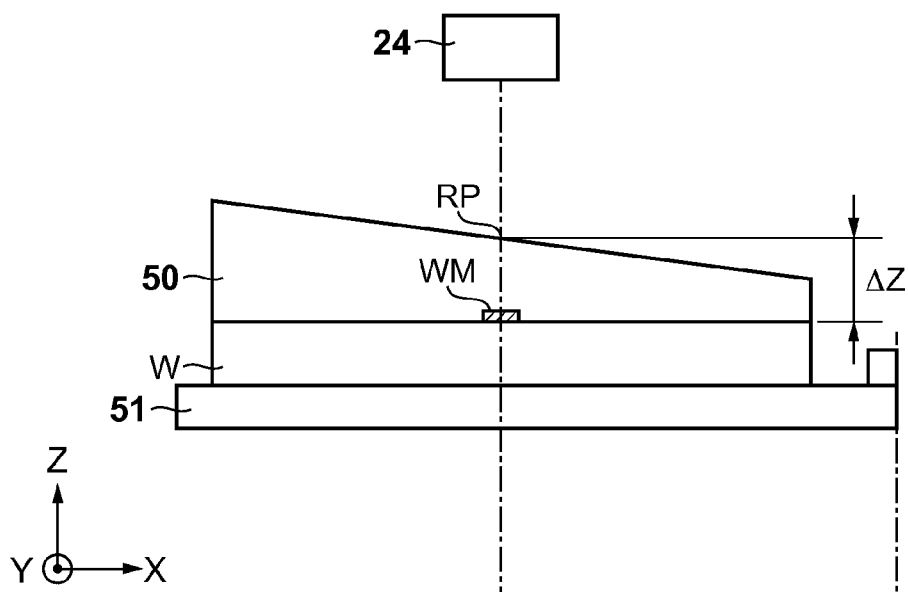
FIGS. 4A and 4B are views for explaining shift correction according to the first embodiment.
Figure 4B:
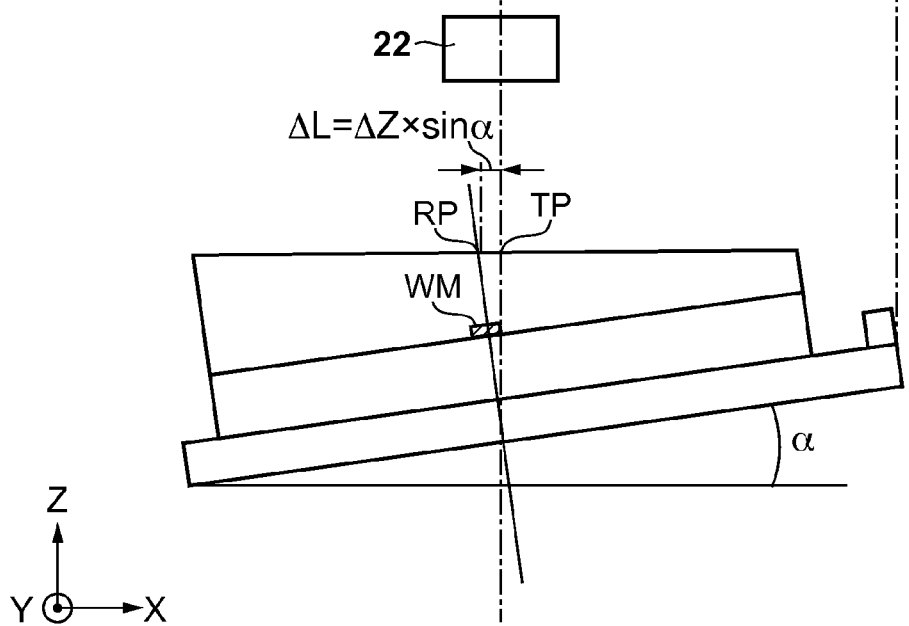

A method of measuring the tilt of the wafer surface and the interval from the wafer surface to the alignment marks using the OA detection system 24, and reflecting the measurement results on alignment correction (shift correction) will be described below. FIGS. 4A and 4B are views for explaining alignment correction (shift correction) according to the first embodiment. The wafer W is set on the wafer chuck 51 on the wafer table 20, and an alignment mark WM is formed on the surface of the wafer W, as shown in FIG. 4A. Also, the surface of the wafer W is coated with a resist 50. In practice, it is difficult to coat the surface of the wafer W with the resist 50 with a uniform thickness due to factors associated with, for example, the surface shape of the wafer W, the state of the alignment mark WM, and the coated condition of the resist 50. Hence, in this embodiment, coating unevenness is assumed to have occurred in the resist 50 on the wafer W, as shown in FIG. 4A, so as to obtain conditions closer to actual conditions. Referring to FIG. 4A, the position to be ideally exposed on the alignment mark WM on the side below the resist 50 is immediately above the alignment mark WM. Referring again to FIG. 4A, reference symbol RP denotes a position to be ideally exposed. When tilt correction is performed so as to reduce a tilt a of the resist surface in exposure, a shift (shift error) may occur between the position RP to be ideally exposed and an actually exposed position TP. Correction of this shift will be referred to as shift correction hereinafter.

Figure 5:
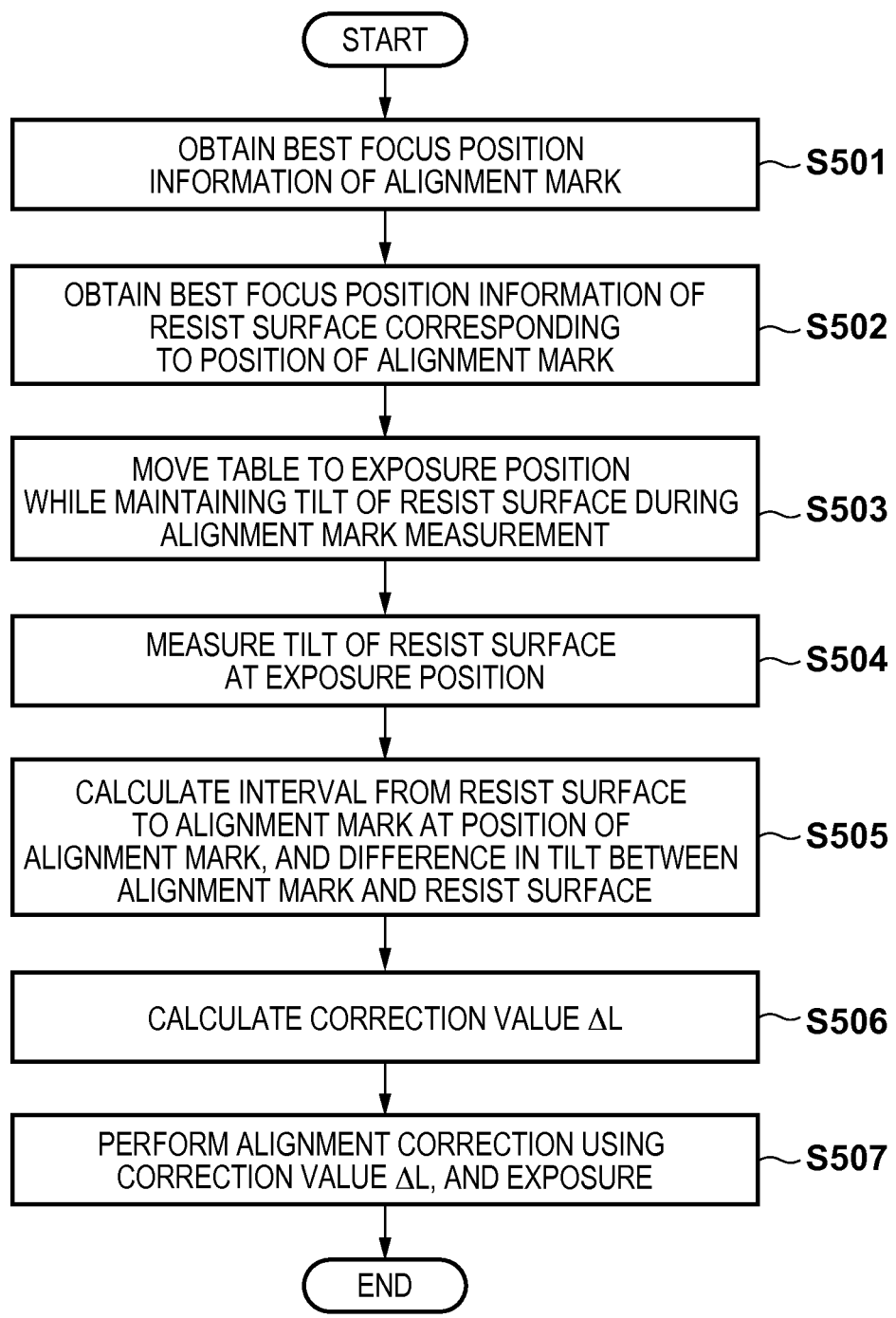
FIG. 5 is a flowchart for explaining the sequence of shift correction according to the first embodiment.

The sequence of shift correction according to this embodiment will be described with reference to a flowchart shown in FIG. 5. In step S501, the OA detection system 24 (measurement unit) starts to measure the focus position based on an instruction to obtain the difference in focus position relative to the wafer W from a control system 91 (control unit). The OA detection system 24 (measurement unit) uses the alignment mark WM formed on the wafer W as an object to be measured, as shown in FIG. 4A. At this time, the control system 91 (control unit) finely drives the wafer table 20 in the Z-direction, and the AF system 301 of the OA detection system 24 (measurement unit) performs AF measurement to obtain a state (best focus state) in which the focus is adjusted on the alignment mark WM. The AF system 301 obtains focus position information (best focus position information) while the focus is adjusted on the alignment mark WM.

In step S502, the control system 91 (control unit) finely drives the wafer table 20 in the Z-direction. The AF system 301 performs AF measurement to obtain a state (best focus state) in which the focus is adjusted on the resist surface corresponding to the position at which the alignment mark WM is formed. The AF system 301 obtains focus position information (best focus position information) while the focus is adjusted on the resist surface corresponding to the position at which the alignment mark WM is formed.

In step S503, the control system 91 (control unit) moves the wafer table 20 to an exposure position while maintaining the tilt of the wafer table (maintaining the tilt of the resist surface on the alignment mark WM). In step S504, the OA detection system 24 (measurement unit) measures the tilt of the resist surface at the exposure position.

In step S505, the control system 91 (control unit) calculates the distance (interval) from the resist surface RP to the alignment mark WM based on the pieces of focus position information obtained in steps S501 and S502. Also, the control system 91 (control unit) calculates the difference in tilt between the resist surface and the position of the alignment mark WM (the tilt of the resist surface with respect to the position of the alignment mark WM) based on the tilt of the resist surface obtained in step S504.

In step S506, the control system 91 (control unit) calculates a correction value ΔL from the distance (interval) from the alignment mark WM to the resist surface, and the difference in tilt between the resist surface and the position of the alignment mark WM. A method of calculating the correction value ΔL will be described in more detail later.

In step S507, the control system 91 (control unit) drives the wafer table 20 into the X-Y plane to correct a shift in position to be exposed, that may occur upon tilt driving of the wafer table 20, using the correction value ΔL (shift correction), and performs exposure. The above-mentioned method is a basic shift correction method in tilt driving of the wafer table 20. Only one alignment mark WM is assumed in this embodiment, but if a plurality of alignment marks are used, it is only necessary to execute steps S501 and S502 in correspondence with each alignment mark, and measure the interval from the resist surface to this alignment mark. Especially the tilt of the wafer is assumed to be equivalent to the slope of a linear function in this embodiment, so the tilt of the resist surface can be expressed using a value common to each mark.

A method of calculating the correction value ΔL will be described below. Let ΔZ be the distance (interval) from the resist surface at the position of the alignment mark WM to the alignment mark WM. Let a be the difference in tilt between the position of the alignment mark WM and the surface of the resist 50 at the exposure position (the tilt of the surface of the resist 50 with respect to the position of the alignment mark WM). Then, the control system 91 can calculate the correction value ΔL in accordance with:

$$\Delta L = \Delta Z \times \sin \alpha \quad (1)$$

A shift in position RP to be exposed, that may occur upon tilt driving of the wafer table 20, can be corrected using the correction value ΔL calculated in accordance with relation (1) (shift correction).

Figure 6A:
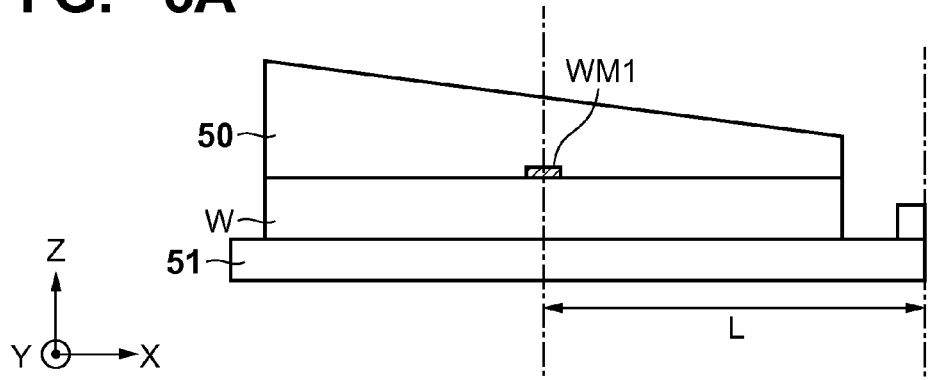
FIGS. 6A, 6B, and 6C are views for explaining the state in which exposure is performed upon shift correction according to the first embodiment.
Figure 6B:
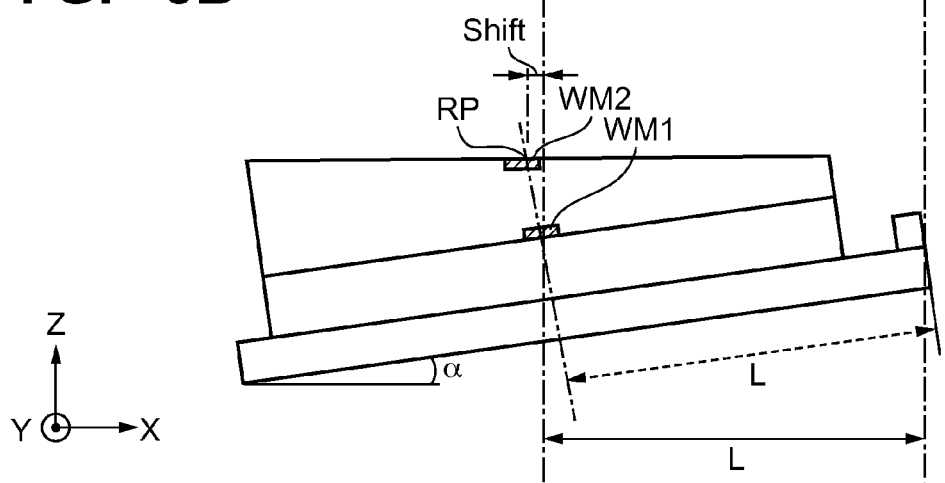
Figure 6C:
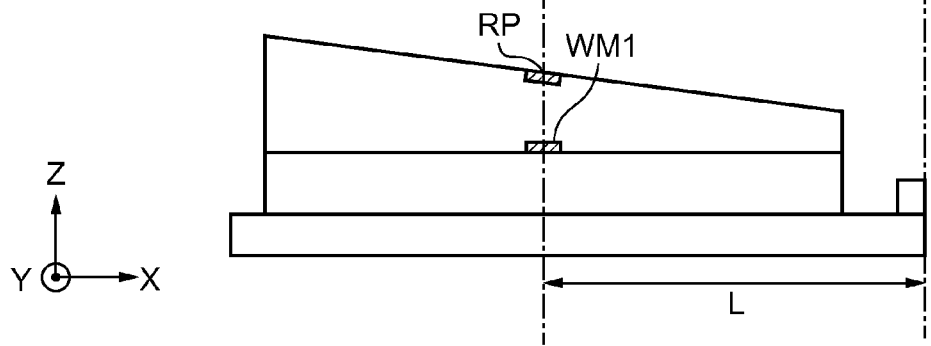

The state in which exposure is performed upon shift correction using the correction value calculated in accordance with relation (1) will be described below with reference to FIGS. 6A to 6C. FIG. 6A shows the alignment state, FIG. 6B shows the exposure state, and FIG. 6C shows the state after exposure. In the state shown in FIG. 6B, based on the correction value calculated in accordance with relation (1), the control system 91 corrects the position of the wafer table 20, and aligns the position RP to be ideally exposed with the position of the alignment mark WM2 relative to the alignment mark WM1. When exposure is performed after alignment, no shift error (shift) occurs due to the influence of the tilt of the resist surface. As long as the correction value calculated in accordance with relation (1) is obtained, the control system 91 need only drive the wafer table 20 using the correction value to correct the shift error in exposure.

Also, even when the interval from the surface of the resist 50 to the alignment mark WM1 is the same in practice, it is often the case that the optical axis of the OA detection system 24 has tilted, or the measurement value varies depending on the process conditions. These phenomena occur due to factors including an error of the telecentricity of the OA detection system 24, and the refractive index of the resist. For correction with a higher accuracy, these values must also be taken into consideration.

Figure 14:
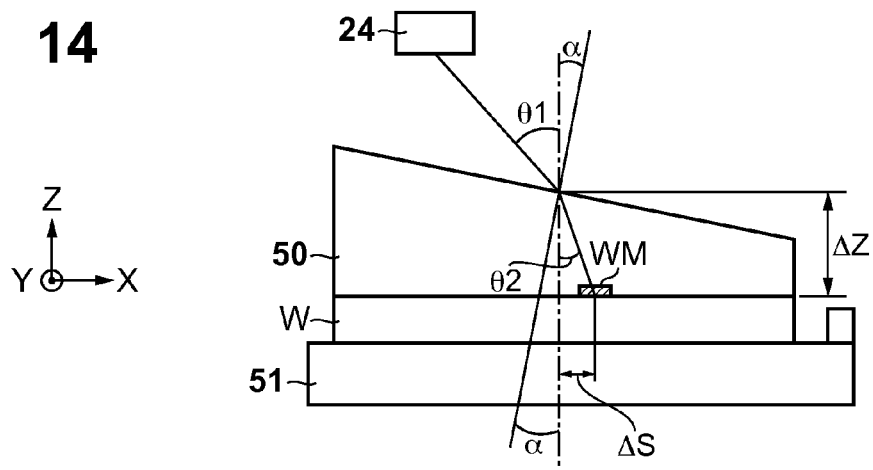
FIG. 14 is a view for explaining shift correction when the tilt of the optical axis of an alignment detection system is taken into consideration.

Shift correction which reflects the tilt of the optical axis of the alignment detection system will be described with reference to FIG. 14. FIG. 14 shows the state in which the alignment mark WM is measured while the optical axis of the OA detection system 24 has tilted by a tilt angle θ1 with respect to a normal to the surface of the wafer W. Referring to FIG. 14, a tilt θ2 of the optical axis after incidence on the resist 50, and a shift ΔS of the measurement value satisfy a relation:

$$\Delta S = \Delta Z \times \tan \theta 2 \quad (2)$$

Let N be the refractive index of the resist 50. Then, according to Snell's law, we have:

$$\sin(\theta 1 + \alpha) = N \times \sin(\theta 2 + \alpha) \quad (3)$$

Note that θ2 in relation (2) can be calculated from relation (3). Hence, when the optical axis of the OA detection system 24 has tilted, the correction value ΔL (relation (1)) in tilt driving of the wafer table 20, and the correction value ΔS (relation (2)) of a shift of the measurement value, that occurs due to the tilt of the OA detection system 24, need only be calculated independently of each other. In calculating the correction value ΔS, the tilt of the surface of the resist 50 with respect to the alignment mark WM is not taken into consideration. Letting a be the tilt of the surface of the resist 50 with respect to the alignment mark WM, and ΔZ be the distance (interval) from the resist surface to the alignment mark WM, the correction value ΔL in tilt driving of the wafer table 20 can be calculated in accordance with relation (1). When the tilt a of the surface of the resist 50 is taken into consideration, ΔL−ΔS need only be reflected in exposure as a correction value.

Note that the correction value ΔL must be obtained while taking into consideration the fact that the characteristic value of a detection signal detected by the OA detection system 24 varies depending on the combination of at least one of the focus position, and the materials of the wafer and the medium between the wafer surface and the alignment mark. When a characteristic value C of the detection signal is taken into consideration, the correction value ΔL in relation (1) can be obtained in accordance with:

$$\Delta L = C \times \Delta Z \times \sin \alpha \quad (4)$$

Although an example in which the resist 50 coated on the wafer W includes only one layer has been described in this embodiment, the material of the medium between the alignment mark WM and the surface of the resist 50 is not limited to a resist of one type (one layer), and may be formed by a plurality of layers made of different materials. In this case, a plurality of layers may be arbitrarily divided or collectively measured to calculate an alignment correction value. Alternatively, the distance (interval) from the resist surface to the alignment mark to be measured under the plurality of layers may be measured for each layer to calculate the correction value ΔL in tilt driving of the wafer table 20.

The thickness of each layer from the alignment mark WM to the resist surface is defined as $\Delta Z_k$ (k is an integer of 1 to n where n is the number of layers), and the tilt of the surface of this layer with respect to the alignment mark WM is defined as $\alpha_k$ (k is an integer of 1 to n where n is the number of layers). Also, when a characteristic value (for example, a value indicating a characteristic such as the refractive index of each layer, or the transmittance of light) corresponding to the material of each layer is defined as a coefficient $C_k$ (k is an integer of 1 to n where n is the number of layers), the correction value ΔL can be obtained in accordance with:

$$\Delta L = \sin\alpha_k \times \sum_{k=1}^{n}(C_k \times \Delta Z_k) \quad (5)$$

Note that ΔZ may be a fixed value represented by, for example, the average or a value in the neighborhood of the average in a lot. Also, the thickness of the resist may be measured by a standard process, its rate of change in each individual process or resist may be obtained in advance, and the obtained result may be reflected on relations (4) and (5), according to which the correction value ΔL is calculated, as a correction coefficient.

Second Embodiment

Figure 7A:
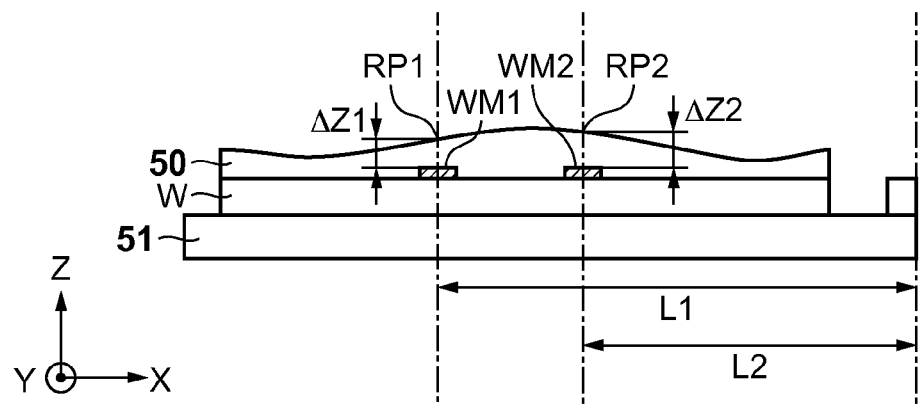
FIGS. 7A, 7B, and 7C are views for explaining shift correction according to the second embodiment.
Figure 7B:
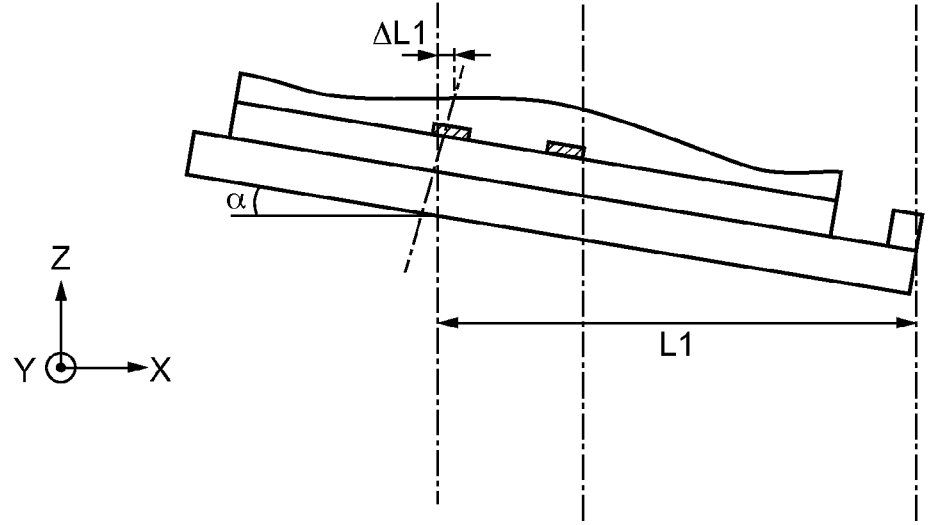
Figure 7C:
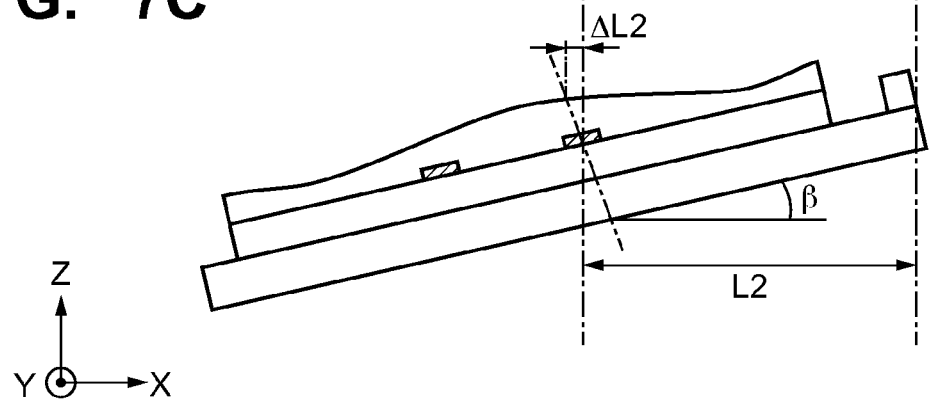

In the first embodiment, the tilt of the resist surface is assumed to be equivalent to the slope of a linear function. However, in the second embodiment, a method of calculating a correction value when the tilt of the resist surface is not equivalent to the slope of a linear function will be described. FIGS. 7A to 7C are views for explaining shift correction according to the second embodiment. A wafer W is set on a wafer chuck 51 on a wafer table 20, and a plurality of alignment marks WM1 and WM2 are formed on the surface of the wafer W, as shown in FIG. 7A. Also, the surface of the wafer W is coated with a resist 50. In this embodiment, the resist 50 is assumed to be relatively thick in the central and peripheral portions of the wafer W so as to obtain conditions closer to actual conditions.

In the first embodiment, the tilt of the resist surface is assumed to be equivalent to the slope of a linear function, as shown in FIG. 4A. In the second embodiment, the tilt of the surface above the alignment mark WM1 and that of the surface above the alignment mark WM2 are assumed to be different from each other, as shown in FIG. 7A. The positions to be ideally exposed relative to the alignment marks WM1 and WM2 are indicated by positions RP1 and RP2 immediately above the alignment marks WM1 and WM2, respectively.

A method of calculating a correction value, and the sequence of a correction process will be described with reference to FIG. 5. Processes in steps S501 and S502 of FIG. 5 are performed for the alignment marks WM1 and WM2, and the distances (intervals) from the positions RP1 and RP2 on the resist surface to the corresponding alignment marks WM1 and WM2 are measured. Let ΔZ1 be the distance (interval) from the position RP1 on the resist surface to the alignment mark WM1, and ΔZ2 be the distance (interval) from the position RP2 on the resist surface to the alignment mark WM2.

A control system 91 moves the wafer table 20 to an exposure position while maintaining the tilt of a wafer table 20 (step S503), and measures the tilt of the resist surface at the exposure position (step S504).

In step S505, the control system 91 calculates the intervals ΔZ1 and ΔZ2 from the positions RP1 and RP2 on the resist surface to the alignment marks WM1 and WM2, based on the pieces of focus position information obtained in steps S501 and S502.

FIG. 7B shows the case wherein the distance ΔZ1 is calculated, and FIG. 7C shows the case wherein the distance ΔZ2 is calculated. Let L1 be the distance from the right end portion of the wafer chuck 51 to the alignment mark WM1, and L2 be the distance from the right end portion of the wafer chuck 51 to the alignment mark WM2.

The control system 91 also calculates the differences α and β in tilt between the resist surfaces and the positions of the alignment marks at the exposure position (the tilts of the resist surfaces with respect to the positions of the alignment marks WM1 and WM2) based on the tilts of the resist surfaces obtained in step S504.

In step S506, the control system 91 calculates correction values ΔL1 and ΔL2 using relation (1) based on the distances (intervals) from the alignment marks WM to the resist surfaces, and the differences in tilt between the resist surfaces and the positions of the alignment marks at the exposure position.

Upon correcting a shift in exposure position, that may occur upon tilt driving of the wafer table 20, the control system 91 corrects the position of the wafer table 20 by the correction value ΔL1 and tilt correction a in a shot corresponding to the position of the alignment mark WM1, and performs exposure. The control system 91 corrects the position of the wafer table 20 by the correction value ΔL2 and tilt correction β in a shot corresponding to the position of the alignment mark WM2, and performs exposure. This makes it possible to correct a shift in position to be exposed, that may occur upon tilt driving of the wafer table 20, in each shot corresponding to the position of each alignment mark.

A global tilt method of correcting the tilt of the wafer W on its entire surface has been described in the first embodiment, while a method of correcting the tilt of the wafer W for each shot has been described in the second embodiment. In the second embodiment, as in the first embodiment, global tilt correction in which the tilt of the wafer W is corrected on its entire surface can be performed. If a plurality of alignment marks are present, a representative alignment mark may be selected from them, and the amount of tilt at the position of the selected alignment mark to serve as a reference may be set as a representative value.

A method of measuring the thickness of the resist from the resist surface to each alignment mark has been described in the first and second embodiments. The scope of the present invention is not limited to this example, and the thickness may be measured at a representative point and used as a representative value as long as a process in which the thickness of the resist is stable is adopted.

An OA detection system 24 can perform global measurement in which the distance from an alignment mark to serve as a reference to the resist surface, and the tilt of the resist surface with respect to the alignment mark are measured as representative values of the entire substrate. Alternatively, the OA detection system 24 performs die-by-die measurement in which the distances from alignment marks formed at different positions within the plane of the substrate to the resist surfaces, and the tilts of the resist surfaces are measured for each shot. The thicknesses of the marks and global tilt/die-by-die tilt measurement can be selected in various modes in accordance with the required accuracy without departing from the scope of the present invention.

Although shift correction in one axial direction has been described in the first and second embodiments, it can similarly be done in other axial directions.

Third Embodiment

Figure 8:
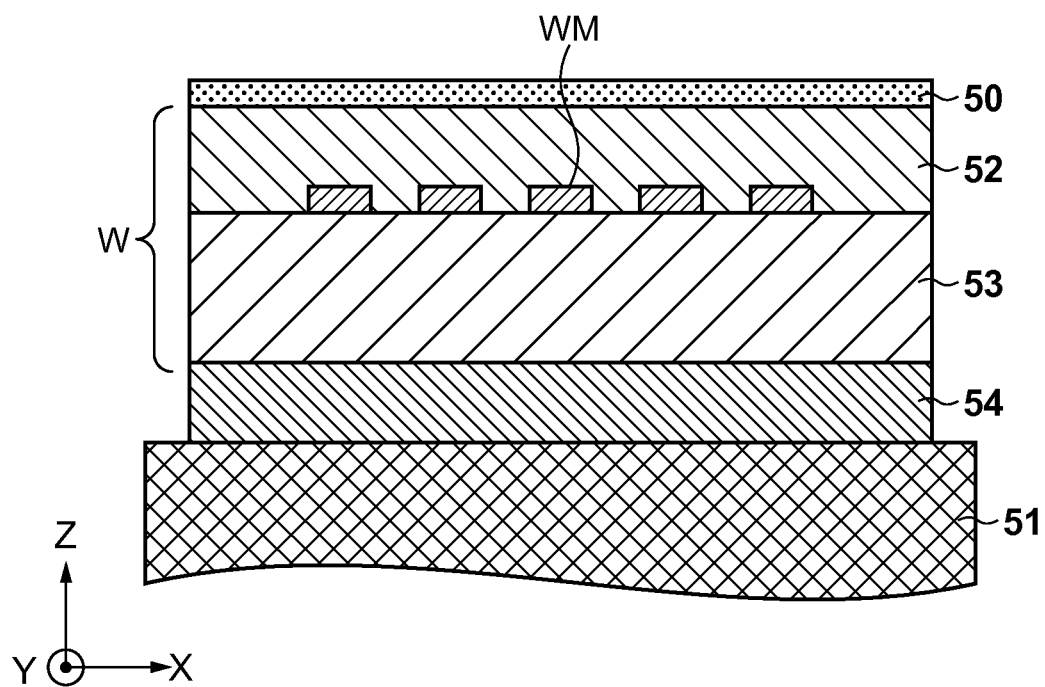
FIG. 8 is a view for explaining a wafer used in shift correction according to the third embodiment.

In the first and second embodiments, the resist has unevenness in thickness. However, in the third embodiment, the present invention is applied to lower surface alignment in which an alignment mark formed on the lower side of an Si wafer W upon transmission through the wafer W is observed. In this embodiment, the wafer W is formed by at least one layer. The wafer W includes at least one of a layer formed by a silicon substrate, and a layer formed by a glass substrate. FIG. 8 is a view for explaining the wafer W used in shift correction according to the third embodiment, and the wafer W is formed by, for example, an Si wafer 52 (silicon substrate) and a glass wafer 53 (glass substrate). The Si wafer 52 (silicon substrate) and glass wafer 53 (glass substrate) are bonded to each other by, for example, an adhesive or an optical contact. The surface of the Si wafer 52 (silicon substrate) is coated with a resist 50 to be exposed. When the surface of the Si wafer 52, which is coated with the resist 50, is set as an upper surface, alignment marks WM are formed on the surface (lower side) of the Si wafer 52, which is coated with no resist 50. The alignment marks WM formed on the surface (lower side) of the Si wafer 52 are formed by a material such as a metal. Because the glass wafer 53 is bonded to the lower surface of the Si wafer 52, the alignment marks WM are confined in the spaces between the Si wafer 52 and the glass wafer 53. An OA detection system 24 irradiates the thus formed alignment marks with infrared light, and receives the light reflected by these alignment marks to measure their positions.

The wafer W is chucked by a wafer chuck 51 by vacuum suction. It is often the case that infrared light is reflected by the surface of the wafer chuck 51, and the reflected infrared light becomes noise light that leads to degradation in quality of an alignment mark image. Hence, the wafer chuck 51 has a stacked structure formed by a plurality of layers (a two-layered structure in an example shown in FIG. 8), and an antireflection film 54 which does not reflect infrared light is formed in the upper surface portion of the wafer chuck 51, which is in contact with the wafer W. Note that the wafer chuck 51 is provided with a cooling mechanism and temperature sensor to suppress a rise in temperature due to infrared light. The cooling mechanism and temperature sensor can control the temperature of the wafer chuck 51 constant so as to suppress contraction of the wafer W, that may occur due to transmission of heat generated by the wafer chuck 51 to the wafer W. A wafer W including alignment marks formed on the lower side of an Si wafer 52 may have deformed, instead of having a flat bond wafer surface shape due to the bimetal effect between the Si wafer 52 and the glass wafer 53. Also, a considerable unevenness in thickness may occur even in the Si wafer 52 and glass wafer 53 themselves. A method of measuring, using the OA detection system 24, the interval from the resist surface of the wafer W to the alignment mark, and the tilt of the resist surface, and reflecting the measurement results on alignment correction will be described in this embodiment.

Figure 9A:
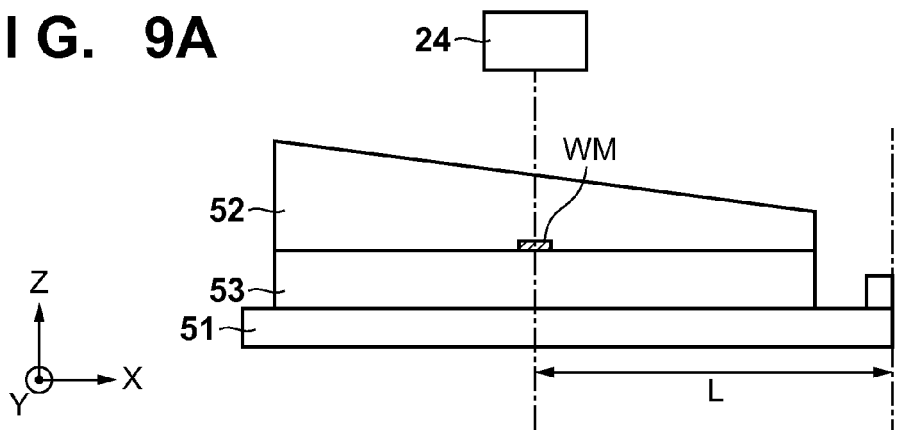
FIGS. 9A, 9B, and 9C are views for explaining shift correction according to the third embodiment.
Figure 9B:
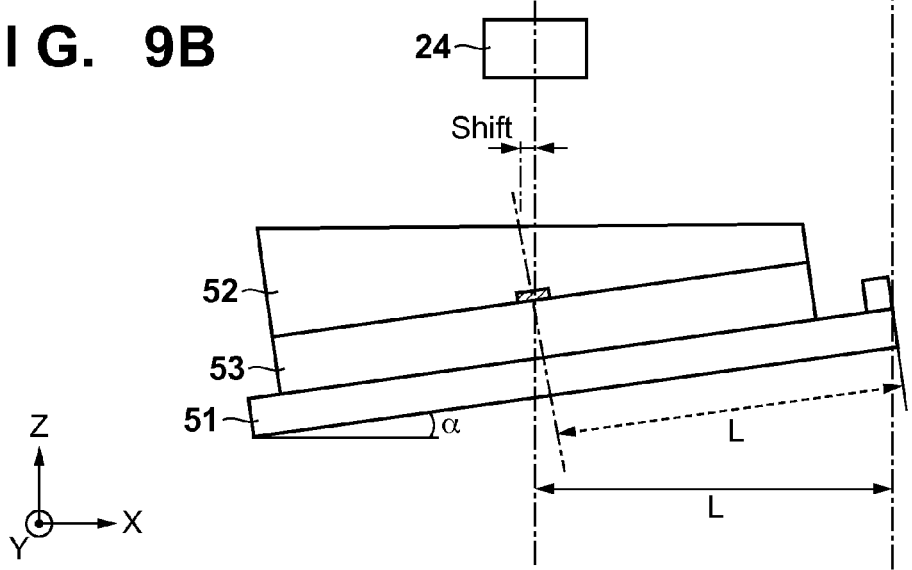
Figure 9C:
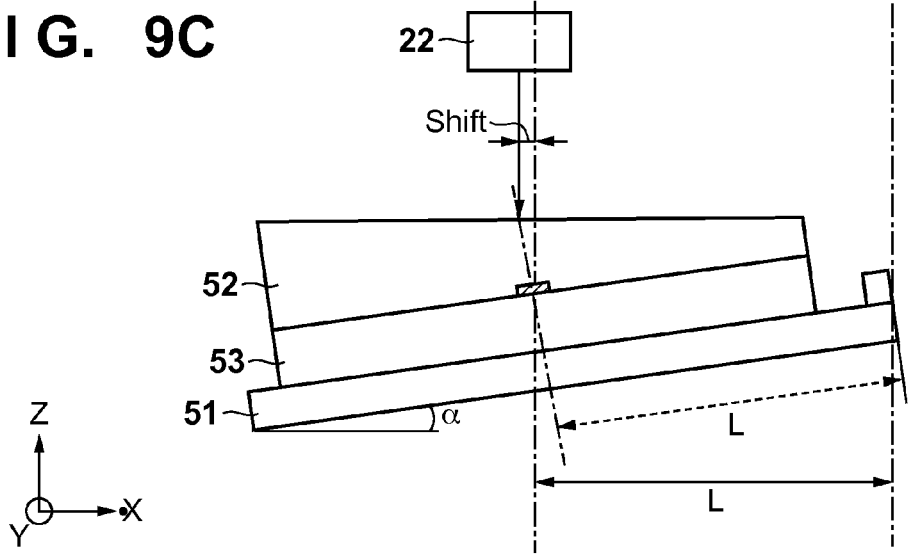

FIGS. 9A to 9C are views for explaining alignment correction (shift correction) according to the third embodiment. The wafer W (Si wafer 52 and glass wafer 53) described with reference to FIG. 8 is set on the wafer chuck 51 on a wafer table 20, as shown in FIG. 9A. The alignment mark WM is formed on the lower surface of the Si wafer 52. Also, the surface of the Si wafer 52 is coated with a resist (not shown). In this embodiment, unevenness in thickness is assumed to have occurred in the Si wafer 52, as shown in FIG. 9A, so as to obtain conditions closer to actual conditions. Note that in this embodiment, the thickness of the resist is assumed to be sufficiently smaller than that of the Si wafer 52, and be even.

Figure 10:
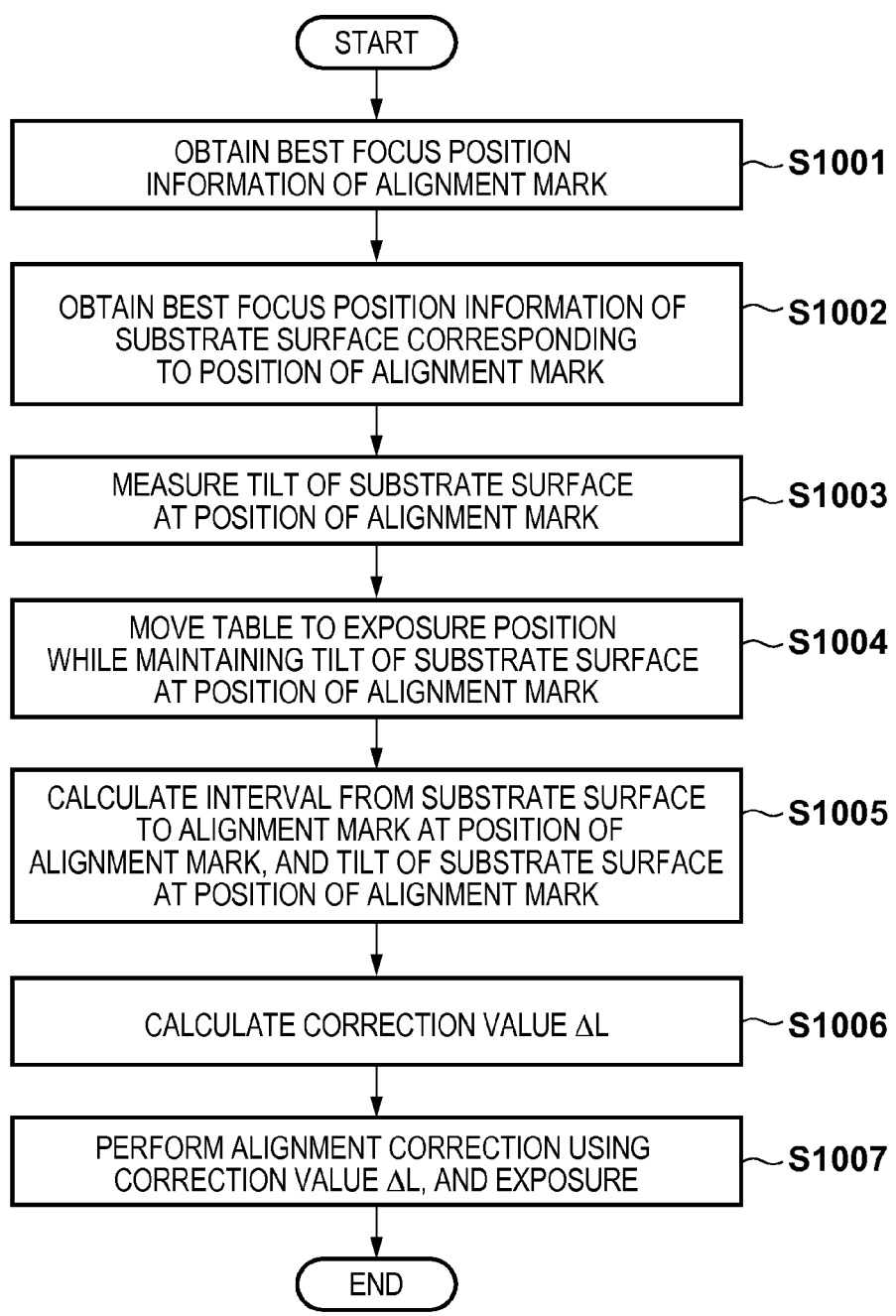
FIG. 10 is a flowchart for explaining the sequence of shift correction according to the third embodiment.

The sequence of shift correction according to this embodiment will be described below with reference to a flowchart shown in FIG. 10. In step S1001, the OA detection system 24 starts to measure the focus position based on an instruction to obtain the difference in focus position of the wafer W from a control system 91. The OA detection system 24 uses the alignment mark WM as an object to be measured, as shown in FIG. 9A. At this time, the control system 91 finely drives a wafer table 20 in the Z-direction, and an AF system 301 of the OA detection system 24 performs AF measurement to obtain a state (best focus state) in which the focus is adjusted on the alignment mark WM. The AF system 301 obtains focus position information (best focus position information) while the focus is adjusted on the alignment mark WM.

In step S1002, the control system 91 finely drives the wafer table 20 in the Z-direction. The AF system 301 performs AF measurement to obtain a state (best focus state) in which the focus is adjusted on the surface of the Si wafer 52 corresponding to the position at which the alignment mark WM is formed. The AF system 301 obtains focus position information (best focus position information) while the focus is adjusted on the resist surface corresponding to the position at which the alignment mark WM is formed.

In step S1003, the OA detection system 24 measures the tilt of the wafer surface at the position of the alignment mark WM, as shown in FIG. 9B. In step S1004, the control system 91 moves the wafer table 20 to an exposure position while maintaining the tilt of the wafer table 20 (maintaining the tilt of the resist surface on the alignment mark WM).

In step S1005, the control system 91 calculates the distance (interval) from the surface of the Si wafer 52 to the alignment mark WM based on the pieces of focus position information obtained in steps S1001 and S1002. Also, the control system 91 calculates the difference in tilt between the wafer surface and the position of the alignment mark WM at the exposure position (the tilt of the wafer surface with respect to the position of the alignment mark WM) based on the tilt of the wafer surface obtained in step S1003.

In step S1006, the control system 91 calculates a correction value $\Delta L$ from the distance (interval) from the alignment mark WM to the wafer surface, and the difference in tilt between the wafer surface and the position of the alignment mark WM at the exposure position, which are calculated in the preceding step S1005.

In step S1007, the control system 91 drives the wafer table 20 into the X-Y plane, as shown in FIG. 9C. The control system 91 corrects a shift in position to be exposed, that may occur upon tilt driving of the wafer table 20, using the correction value $\Delta L$ (shift correction), and performs exposure.

Note that in this embodiment, the term "wafer" means a combination of a wafer W and a resist, and the term "wafer surface" also means substantially the surface of a resist (not shown) because the thickness of the resist is smaller than that of the wafer W.

Let $\Delta Z$ be the distance (interval) from the wafer surface at the position of the alignment mark WM to the alignment mark WM. Let a be the difference in tilt between the position of the alignment mark WM and the wafer surface at the exposure position (the tilt of the wafer surface with respect to the position of the alignment mark WM). Then, the control system 91 can calculate the correction value $\Delta L$ in accordance with relation (1).

A method of correcting a system (for example, a single-stage system) which executes a measurement sequence including wafer alignment, focusing, and tilt measurement, and an exposure sequence in series has been described in this embodiment. However, the present invention is not limited to this, and is also applicable to a system (for example, a twin-stage system) which executes a measurement sequence and an exposure sequence in parallel.

As the first method to be applied to a twin-stage system, the interval from the wafer surface to the alignment mark, for example, is calculated in a measurement sequence. Then, it is only necessary to measure the difference in tilt of the wafer surface between the measurement sequence time and the exposure sequence time, calculate a correction value, and perform correction using it.

As the second method, it is only necessary to measure the interval from the wafer surface to the alignment mark, and the tilt of the wafer surface in a measurement sequence, calculate a correction value, and make a shift to an exposure sequence, in which correction is done while the measured tilt is maintained.

In measuring the tilt of the wafer, the tilt of the wafer with respect to the reference mark on the wafer table is measured as a reference for the tilt of the wafer. Then, it is only necessary to adopt a method of measuring the tilt of the reference mark in the exposure sequence, and calculating the tilts of the wafer in the measurement sequence and the exposure sequence.

Figure 11:
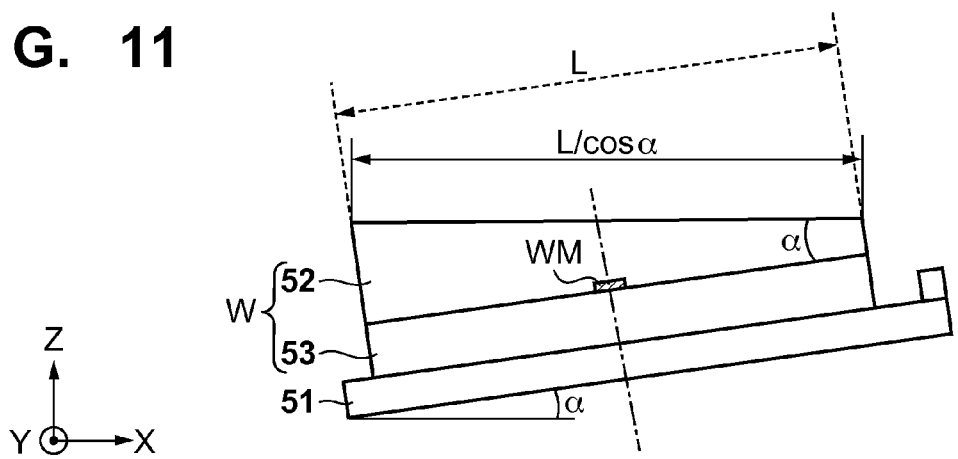
FIG. 11 is a view for explaining magnification correction.
Figure 12A:
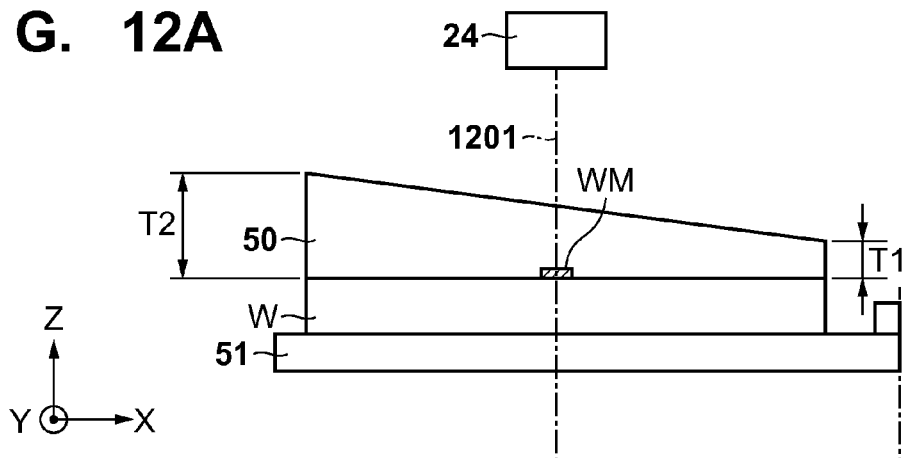
FIGS. 12A and 12B are views for explaining a shift error.
Figure 12B:
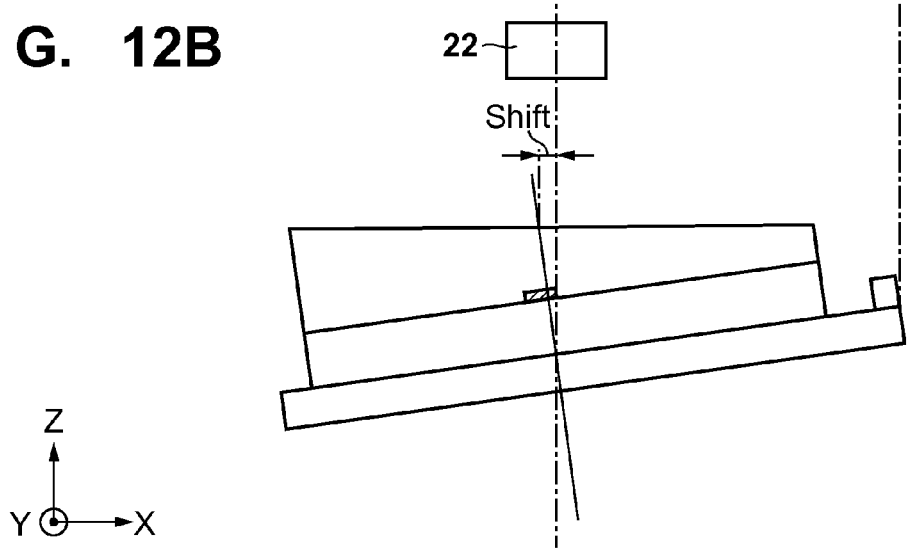
Figure 13A:
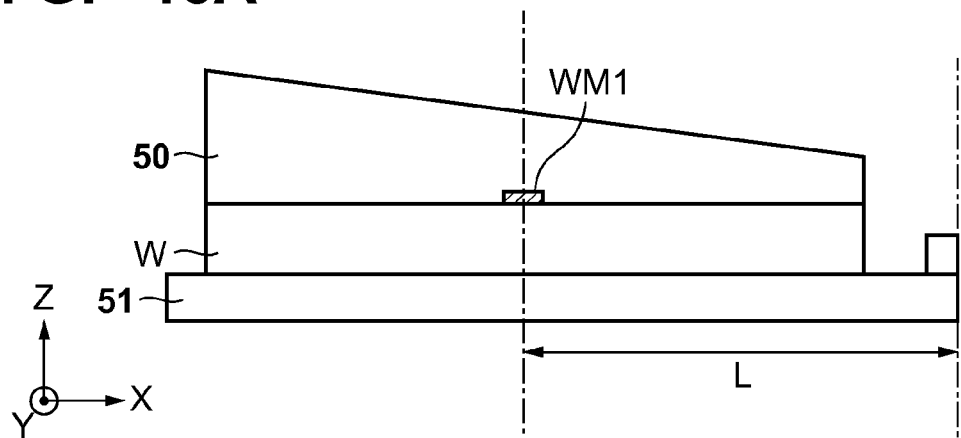
FIGS. 13A, 13B, and 13C are views for explaining exposure using a method which does not perform shift error correction.
Figure 13B:
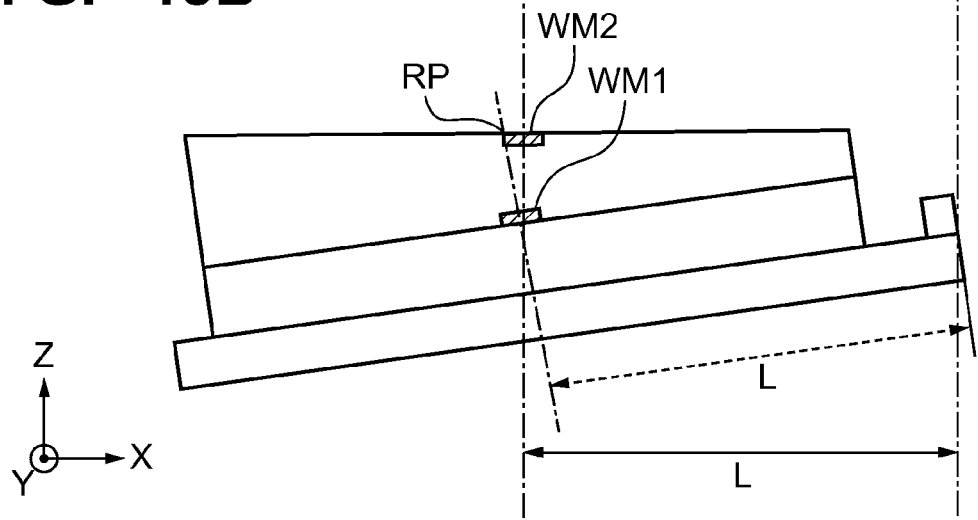
Figure 13C:
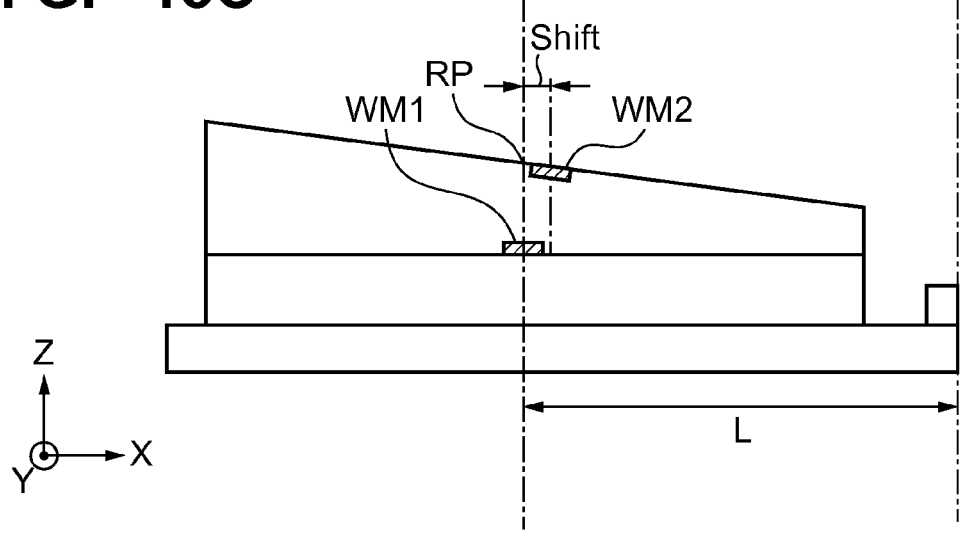

Also, as in this embodiment, it is desired to perform magnification correction to improve the overlay accuracy of a surface layer to be exposed. FIG. 11 is a view for explaining magnification correction, in which a wafer W formed by an Si wafer 52 and glass wafer 53 is set on the wafer chuck 51 on the wafer table 20. An alignment mark WM is formed under the Si wafer 52, as shown in FIG. 8. Also, the wafer chuck 51 has tilted at an angle $\alpha$ with respect to the horizontal axis (X-axis). Referring to FIG. 11, the cross-sectional length of the Si wafer 52 having the alignment mark WM formed on it is defined as L, while that of a surface layer to be exposed is defined as $L/\cos \alpha$. This means that it is only necessary to perform magnification correction of $1/\cos \alpha$ in exposure and perform exposure.

Although focus position information is measured using the OA detection system 24 arranged in the exposure apparatus in the first to third embodiments, the present invention is not limited to this, and a scope in a TTL detection system may be used for measurement in obtaining a best focus position of the alignment mark. Also, a method of measuring the wafer surface is not limited to measurement which uses a focus/position detection system in the exposure apparatus, and the wafer surface may be measured in advance in the exterior of the exposure apparatus, and the measurement result may be obtained and reflected on the alignment result. In this case, the control system 91 functions as an obtaining unit which obtains the distance from the alignment mark to the resist surface, and the tilt of the resist surface, which are measured by a position detection system outside the exposure apparatus. At this time, the control system 91 obtains the characteristic value of the material, that forms the resist, from a holding unit which holds it advance. The holding unit may be disposed inside or outside the exposure apparatus.

According to the above-mentioned embodiments, it is possible to correct a shift between a position to be ideally exposed and an actually exposed position to perform exposure upon high-accuracy alignment.

Fourth Embodiment

In the above-mentioned embodiments, the upper surface of the wafer W, on which the alignment mark WM is formed, that is, the upper surface of the glass wafer 53 has not tilted with respect to the surface of the wafer chuck 51. However, in practice, a surface on which an alignment mark is formed may tilt. Due, for example, to polishing unevenness of the wafer, the upper surface of the wafer W or that of the glass wafer 53 may tilt.

Figure 15A:
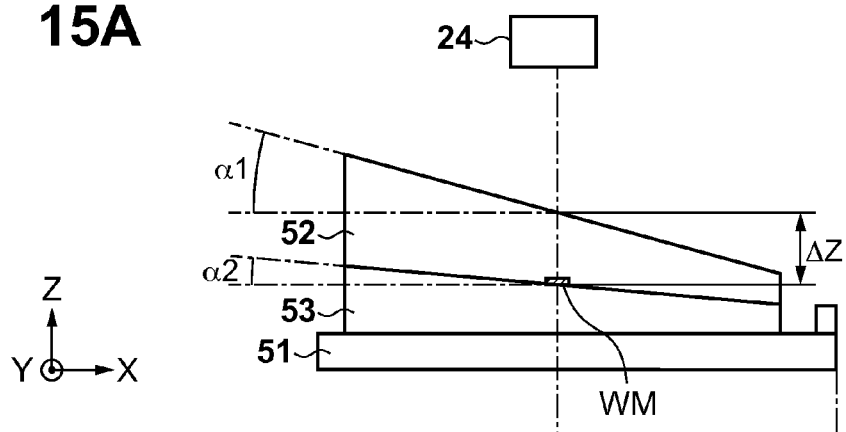
FIGS. 15A and 15B are views for explaining shift correction according to the fourth embodiment, in which the tilt angle of a surface on which an alignment mark WM is formed is reflected on a correction value.
Figure 15B:
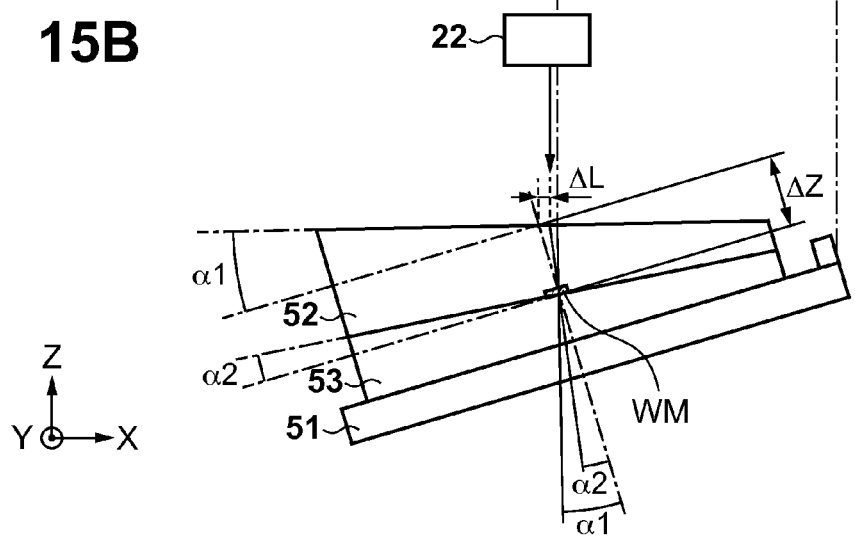

FIGS. 15A and 15B are schematic views for explaining the case wherein a surface on which an alignment mark is formed has tilted. Note that the same reference numerals as in the above-mentioned embodiments denote the same constituent components in FIGS. 15A and 15B, and a description thereof will not be given. In this embodiment as well, a glass wafer 53 is set (held) on a wafer chuck 51, as shown in FIGS. 15A and 15B. FIG. 15A shows the state in which the tilt of a resist surface (not shown) is not corrected, while FIG. 15B shows the state in which the tilt of the resist surface (not shown) is corrected. Also, in this embodiment, the surface (a surface on which an alignment mark WM is formed) of the glass wafer 53 is assumed to have tilted at an angle α2 with respect to the scanning surface (equivalent to the surface of the wafer chuck 51) of a wafer stage (not shown). The surface of an Si wafer 52 (silicon substrate) is coated with a resist to be exposed. The surface (resist surface) of the Si wafer 52 coated with the resist is assumed to have a tilt angle α1 with respect to the scanning surface (equivalent to the surface of the wafer chuck 51) of the wafer stage (not shown).

When the method described in any of the above-mentioned embodiments is used, it is necessary to reflect, on the correction value, the tilt angle α2 of the surface on which the alignment mark WM is formed. Note that as a method of reflecting the tilt angle α2 on the correction value, it is only necessary to calculate the terms (α) of the tilt in relations (1), (4), and (5) for calculating a correction value ΔL as a tilt angle difference (α1−α2). For example, relation (1) for calculating a correction value ΔL need only be rewritten as:

$$\Delta L = \Delta Z \times \sin(\alpha 1 - \alpha 2) \quad (6)$$

Although an exemplary case wherein the tilt angles α1 and α2 satisfy a relation α1>α2 has been described in an example shown in FIGS. 15A and 15B, the present invention is not limited to this case, and the tilt angles α1 and α2 may satisfy a relation α1<α2. FIGS. 16A and 16B show the case wherein the tilt angle α1 of the surface (a surface coated with a resist) of the Si wafer 52, and the tilt angle α2 of a surface on which an alignment mark is formed satisfy a relation α1<α2 when α1 has a negative value. FIG. 16A shows the state in which the tilt of a resist surface (not shown) is not corrected, while FIG. 16B shows the state in which the tilt of the resist surface (not shown) is corrected. For example, relation (1) for calculating a correction value ΔL need only be rewritten as:

$$\Delta L = \Delta Z \times \sin(-\alpha 1 - \alpha 2) \quad (7)$$
$$= -\Delta Z \times \sin(\alpha 1 + \alpha 2)$$

The sign indicates the correction direction. Although the surface (the surface coated with the resist) of the Si wafer 52, and the surface (the upper surface of the glass wafer 53) on which the alignment mark WM is formed have tilted in this embodiment, the present invention is not limited to this configuration. The surface of the wafer chuck 51, for example, may have tilted. The stage scanning surface and the surface of the wafer chuck 51 may have an angular difference as long as the above-mentioned angles α1 and α2 can be obtained.

Also, the tilt of the surface (the surface coated with the resist) of the Si wafer 52, and that of the surface (the upper surface of the glass wafer 53) on which the alignment mark WM is formed can be obtained at the position of the alignment mark WM at three or more points as long as best focus position information of the alignment mark WM is obtained by an OA detection system 24.

Moreover, although shift correction in the X-Z plane has been exemplified in this embodiment, a correction value can be obtained using the same method in the Y-Z plane as well. Although the case wherein the wafer W is formed by the Si wafer 52 and glass wafer 53 has been exemplified as the case wherein the surface on which the alignment mark WM is formed has tilted, the present invention is also applicable to a configuration as shown in, for example, FIGS. 4A and 4B or 6A to 6C. In this case, the tilt angle of the surface (the surface of the wafer W) on which the alignment mark is formed need only be defined as α2, while that of the surface coated with the resist is defined as α1. The tilt of the surface (resist surface) of the Si wafer 52, and that of the surface (the upper surface of the glass wafer 53) on which the alignment mark WM is formed may be measured using the global scheme, or measured using the die-by-die scheme upon selecting a specific region.

The application of the correction methods according to the above-mentioned embodiments is not limited to a semiconductor manufacturing apparatus. These correction methods are applicable not only to an exposure apparatus in a projection optical system, but also to, for example, a mirror reflection liquid crystal exposure apparatus.

Fifth Embodiment

A method of manufacturing a device using the above-mentioned exposure apparatus is suitable for manufacturing devices such as a semiconductor device and a liquid crystal device. This method can include a step of exposing a substrate coated with a photosensitive agent to light using the above-mentioned exposure apparatus, and a step of developing the exposed substrate. This method can also include subsequent known steps (for example, oxidation, film formation, vapor deposition, doping, planarization, etching, resist removal, dicing, bonding, and packaging).

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-082090, filed Mar. 30, 2012, which is hereby incorporated by reference herein in its entirety.

What is claimed is:

1. An exposure apparatus which exposes a resist on a substrate to light via an optical system, the apparatus comprising:
 a table configured to position the substrate at an exposure position upon holding the substrate;
 an obtaining unit configured to obtain a distance from an alignment mark formed on the substrate to a resist surface at a position of the alignment mark, and a tilt of the resist surface with respect to a predetermined surface; and
 a control unit configured to calculate a correction value for correcting a shift in exposure position, that occurs upon tilt driving of said table, using the distance and the tilt, and control a position of said table in accordance with the correction value.

2. The apparatus according to claim 1, wherein the predetermined surface is a surface of the substrate, on which the alignment mark is formed.

3. The apparatus according to claim 1, wherein said control unit obtains the correction value $\Delta L$ in accordance with:

$$\Delta L = \Delta Z \times \sin \alpha$$

where $\Delta Z$ is the distance, and $\alpha$ is the tilt.

4. The apparatus according to claim 1, wherein when the resist is formed by a plurality of layers made of different materials, said obtaining unit obtains, as the distance, a thickness of each layer from the alignment mark to the resist surface,
 said obtaining unit obtains, with respect to the predetermined surface, a tilt of a surface of the each layer, and a characteristic value of a material of the each layer, and
 said control unit calculates the correction value by using the thickness of each layer, the tilt of the surface of the each layer, and the characteristic value of a material of the each layer.

5. The apparatus according to claim 1, wherein when the alignment mark is formed on a lower surface of the substrate, said obtaining unit obtains a thickness of each layer from the alignment mark to the resist surface, a tilt of a surface of the each layer with respect to the predetermined surface, and a characteristic value of a material of the each layer, and
 said control unit calculates the correction value by using the thickness of each layer, the tilt of the surface of the each layer, and the characteristic value of a material of the each layer.

6. The apparatus according to claim 5, wherein the substrate includes at least one of a layer formed by a silicon substrate, and a layer formed by a glass substrate.

7. The apparatus according to claim 4, wherein said control unit obtains the correction value $\Delta L$ in accordance with:

$$\Delta L = \sin \alpha_k \times \sum_{k=1}^{n} (C_k \times \Delta Z_k)$$

where $\Delta Z_k$ is the thickness of the each layer, $\alpha_k$ is the tilt of the surface of the each layer, and $C_k$ is a coefficient representing the characteristic value of the material of the each layer ($k$ is an integer of 1 to $n$, and $n$ is the number of layers).

8. The apparatus according to claim 1, further comprising:
 a measurement unit configured to perform one of global measurement in which a distance from an alignment mark to serve as a reference to the resist surface, and the tilt of the resist surface are measured as representative values of the entire substrate, and die-by-die measurement in which a distance from an alignment mark, formed at a different position within a plane of the substrate, to the resist surface, and the tilt of the resist surface are measured,
 wherein said obtaining unit obtains the measurement result obtained by said measurement unit.

9. A method of controlling an exposure apparatus which includes a table which positions a substrate at an exposure position upon holding the substrate, and exposes a resist on the substrate to light via an optical system, the method comprising:
 an obtaining step of obtaining a distance from an alignment mark formed on the substrate to a resist surface at a position of the alignment mark, and a tilt of the resist surface with respect to a predetermined surface;
 a calculation step of calculating a correction value for correcting a shift in exposure position, that occurs upon tilt driving of the table, using the distance and the tilt; and
 a control step of controlling a position of the table in accordance with the correction value calculated in the calculation step.

10. A method of manufacturing a device, the method comprising steps of:
 exposing a resist on a substrate to light using an exposure apparatus comprising a table configured to position the substrate at an exposure position upon holding the substrate; an obtaining unit configured to obtain a distance from an alignment mark formed on the substrate to a resist surface at a position of the alignment mark, and a tilt of the resist surface with respect to a predetermined surface; and a control unit configured to calculate a correction value for correcting a shift in exposure position, that occurs upon tilt driving of said table, using the distance and the tilt, and control a position of said table in accordance with the correction value; and
 developing the exposed resist.

11. The apparatus according to claim 1, wherein when the alignment mark is formed on a lower surface of the substrate, said obtaining unit obtains a thickness of each layer from the alignment mark to the resist surface, a tilt of a surface of each layer with respect to the predetermined surface, and
 said control unit calculates the correction value by using the thickness of each layer, and the tilt of the surface of each layer.

* * * * *